United States Patent
Chang et al.

(10) Patent No.: US 10,523,238 B2
(45) Date of Patent: Dec. 31, 2019

(54) CODING AND DECODING METHOD, APPARATUS, AND SYSTEM FOR FORWARD ERROR CORRECTION

(71) Applicant: Huawei Technologies Co., Ltd., Shenzhen (CN)

(72) Inventors: Deyuan Chang, Shenzhen (CN); Fan Yu, Chengdu (CN); Zhiyu Xiao, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 444 days.

(21) Appl. No.: 14/319,729

(22) Filed: Jun. 30, 2014

(65) Prior Publication Data

US 2014/0317477 A1 Oct. 23, 2014

Related U.S. Application Data

(63) Continuation of application No. PCT/CN2011/085017, filed on Dec. 30, 2011.

(51) Int. Cl.
*H03M 13/11* (2006.01)
*H03M 13/33* (2006.01)
(Continued)

(52) U.S. Cl.
CPC ....... *H03M 13/116* (2013.01); *H03M 13/036* (2013.01); *H03M 13/1154* (2013.01); *H03M 13/333* (2013.01); *H03M 13/63* (2013.01)

(58) Field of Classification Search
CPC .. H03M 13/63; H03M 13/333; H03M 13/116; H03M 13/1154; H03M 13/036
(Continued)

(56) References Cited

U.S. PATENT DOCUMENTS

2009/0100311 A1 4/2009 Song et al.
2010/0050048 A1 2/2010 Djordjevic et al.
(Continued)

FOREIGN PATENT DOCUMENTS

CN 1960188 A 5/2007
CN 101431337 A 5/2009
(Continued)

OTHER PUBLICATIONS

Qi, Yinghao et al., "Reduced Complexity Algorithm for QC-LDPC Coded Blind Frame Synchronization," The Institute of Electronics, Information and Communication Engineers, vol. E94-B, No. 4, Apr. 2011, pp. 1057-1062.
(Continued)

*Primary Examiner* — Kyle Vallecillo
(74) *Attorney, Agent, or Firm* — Slater Matsil, LLP

(57) ABSTRACT

The present invention discloses a coding and decoding method, apparatus, and system for forward error correction, and pertains to the field of communications. The method includes: determining check matrix parameters of time-varying periodic LDPC convolutional code according to performance a transmission system, complexity of the transmission system, and a synchronization manner for code word alignment, constructing a QC-LDPC check matrix according to the determined check matrix parameters, and obtaining a check matrix ($H_c$) of the time-varying periodic LDPC convolutional code according to the QC-LDPC check matrix; de-blocking, according to requirements of the $H_c$, data to be coded, and coding data of each sub-block according to the $H_c$, so as to obtain multiple code words of the LDPC convolutional code; and adding the multiple code words of the LDPC convolutional code in a data frame and sending the data frame.

21 Claims, 18 Drawing Sheets

(51) Int. Cl.
*H03M 13/00* (2006.01)
*H03M 13/03* (2006.01)

(58) Field of Classification Search
USPC .......................................................... 714/776
See application file for complete search history.

(56) References Cited

U.S. PATENT DOCUMENTS

| | | | |
|---|---|---|---|
| 2010/0153819 | A1 | 6/2010 | Ueng et al. |
| 2010/0199153 | A1 | 8/2010 | Okamura et al. |
| 2010/0251062 | A1 | 9/2010 | Chen et al. |
| 2010/0269009 | A1 | 10/2010 | Okamura et al. |
| 2011/0004802 | A1* | 1/2011 | Bialkowski et al. ......... 714/752 |
| 2011/0041044 | A1 | 2/2011 | Murakami et al. |
| 2011/0283162 | A1* | 11/2011 | Murakami .................. 714/758 |
| 2012/0254685 | A1* | 10/2012 | Ku .................. H03M 13/1117 714/755 |

FOREIGN PATENT DOCUMENTS

| | | |
|---|---|---|
| CN | 102057579 A | 5/2011 |
| CN | 102075198 A | 5/2011 |
| EP | 2182639 A1 | 5/2010 |
| EP | 2296283 A1 | 3/2011 |
| JP | 2009246927 A | 10/2009 |
| KR | 20080052832 A | 6/2008 |
| WO | 2011024206 A1 | 3/2011 |

OTHER PUBLICATIONS

Tanner, R. Micheal et al., "LDPC Block and Convolutional Codes Based on Circulant Matrices," IEEE Transactions on Information Theory, vol. 50, No. 12, Dec. 2004, XP-011122837, pp. 2966-2986.
Wang, Yixiang et al., "Quasi-Cyclic Low-Density Parity-Check Convolutional Code," IEEE 7th International Conference on Wireless and Mobile Computing, Networking and Communications, 2011, pp. 351-356.
LDPC, "Low-Density Parity-Check (LDPC) code," Sep. 1, 2009, 135 pages.
LDPC, partial translation of "Key Technology LDPC Codes in High-Speed Data Transmission," Aug. 19, 2010, 7 pages.
Pusane, Ali Emre, et al., "On Deriving Good LDPC Convolutional Codes from QC LDPC Block Codes," IEEE, Nice, France, Jun. 24-29, 2007, pp. 1221-1225.
Sui, Hui-qiao, "Convolution Code Identification and Codeword Synchronization Based on Parity-Check Matrix," Radio Communications Technology, vol. 34, No. 1, Spring 2008, 3 pages.

* cited by examiner

| H1 | | | | | | | | |
|----|----|----|----|----|----|----|----|----|
| H2 | H6 | | | | | | | |
| H3 | H7 | H11 | | | | | | |
| H4 | H8 | H12 | H16 | | | | | |
| 0 | H5 | H9 | H13 | H1 | C*MS | | | |
| | | H10 | H14 | H2 | H6 | | | |
| | | | H15 | H3 | H7 | H11 | | |
| | | | | H4 | H8 | H12 | H16 | |
| | | | | | H5 | H9 | H13 | H1 |
| | | | | | | H10 | H14 | H2 |
| | | | | | | | H15 | H3 |
| | | | | | | | | H4 |

| ID | C1 | C2 | C3 | C4 | ID | C5 | C6 |

Receive a data frame containing multiple code words of LDPC convolutional code, where the multiple code words of LDPC convolutional code are obtained according to the coding of the check matrix $H_c$ of the time-varying periodic LDPC convolutional code, the $H_c$ is obtained according to a QC-LDPC check matrix, and the frame header FAS of the data frame used to identify the correspondence between the multiple code words of LDPC convolutional code and the $H_c$ is added in the data frame — 1401

Obtain the $H_c$ that is used when the multiple code words of the LDPC convolutional code are obtained by performing coding, identify the frame header FAS of the data frame, and determine the correspondence between the multiple code words of the LDPC convolutional code and the $H_c$ according to the frame header FAS of the data frame — 1402

Decode the multiple code words of the LDPC convolutional code according to the determined correspondence between the multiple code words of the LDPC convolutional code and the $H_c$ — 1403

FIG. 14

| | C1 | C2 | C3 | C4 | C5 | C6 | C7 | C8 | C9 | C10 | C11 |
|---|---|---|---|---|---|---|---|---|---|---|---|
| 0 | | | $H_c4$ | | 18360 | | | | | | |
| | | | $H_c3$ | | | | | | | | |
| | | | | $H_c2$ | | | | | | | |
| | | | | | $H_c1$ | | | | | | |
| | | | | | | $H_c4$ | | | | | |
| | | | | | | | $H_c3$ | | | | |
| | | | | | | | | $H_c2$ | | | |
| | | | | | | | | | $H_c1$ | | |

FIG. 15

| | C1 | C2 | C3 | C4 | C5 | C6 | C7 | C8 | C9 | C10 | C11 |
|---|---|---|---|---|---|---|---|---|---|---|---|
| 0 | — | — | — | $H_c4$ | 10128 | | | | | | |
| | | | | $H_c3$ | | | | | | | |
| | | | | | $H_c2$ | | | | | | |
| | | | | | $H_c1$ | | | | | | |
| | | | | | | | $H_c4$ | | | | |
| | | | | | | | | $H_c3$ | | | |
| | | | | | | | | | $H_c2$ | | |
| | | | | | | | | | | $H_c1$ | |

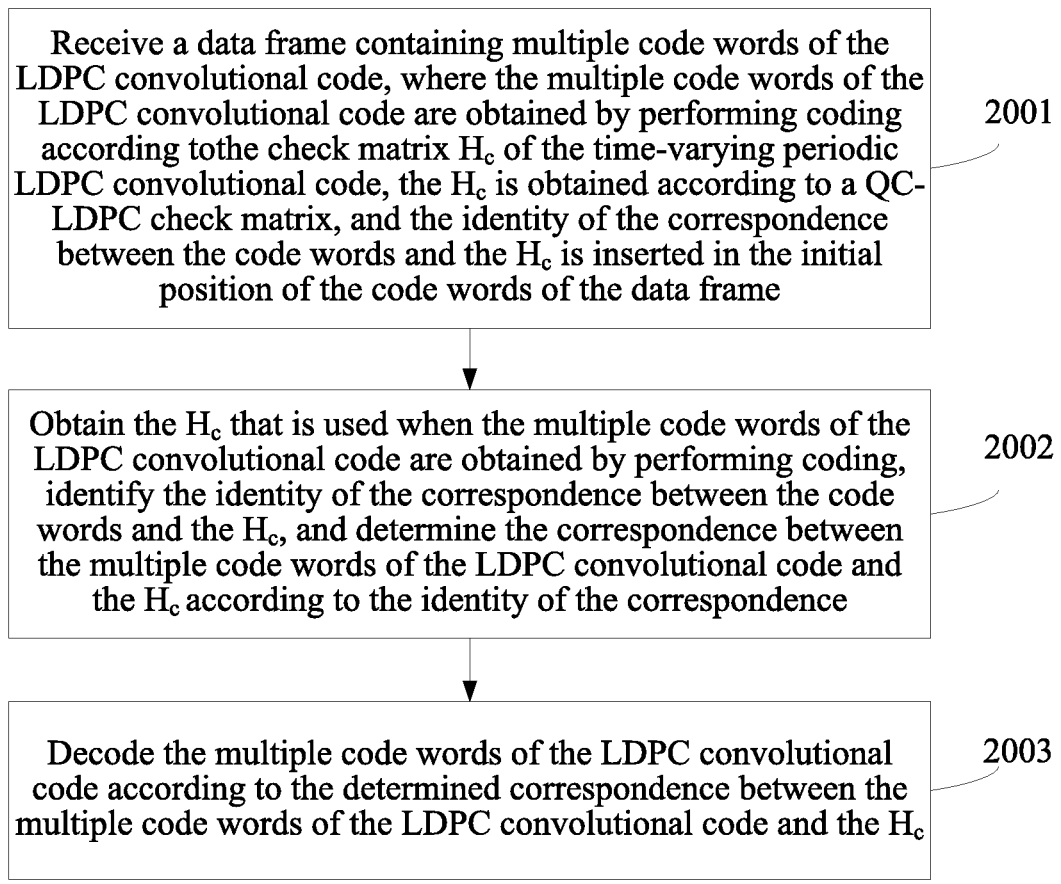

CODING AND DECODING METHOD, APPARATUS, AND SYSTEM FOR FORWARD ERROR CORRECTION

This application is a continuation of International Application No. PCT/CN2011/085017, filed on Dec. 30, 2011, which is hereby incorporated by reference in its entirety.

TECHNICAL FIELD

The present invention relates to the field of communications, and in particular, to a coding and decoding method, apparatus, and system for forward error correction.

BACKGROUND

With the development of the high-speed optical transmission system, higher requirements are placed on the FEC (Forward Error Correction, forward error correction) technology. As a type of FEC code words with gain characteristics of approaching the Shannon limit, LDPC (Low Density Parity Check, low density parity check) codes have become a coding and decoding manner widely used in the FEC technology.

When LDPC codes are adopted to implement FEC, in a first existing technology, LDPC block codes are used to resist noises in a high-speed coherent optical transmission system; in a second existing technology, time-invariant LDPC convolutional code is used as an FEC error correction manner; in a third existing technology, time-varying periodic LDPC convolutional code is used to perform FEC protection on data in a wireless LAN (Local Area Network, wireless local area network).

When developing the present invention, the inventor finds at least the following disadvantages in the prior art:

For LDPC block code used in the first existing technology, a very great code length is required to obtain a satisfactory performance, while the implementation of a very great length of LDPC block codes leads to a very high complexity. For the time-invariant LDPC convolutional code used in the second existing technology, the performance is a little weak, and the risk of the occurrence of an error floor after the correction is very high, and meanwhile, it is difficult to implement high-parallelism-degree decoding through the check matrix structure thereof and the throughput is low, which makes it inapplicable to optical transmission. In the third existing technology, LDPC convolutional code is used as block code through cut-off, the manner not only reduces the transmission efficiency but also is inapplicable to an optical transmission system, and meanwhile, it is difficult to achieve high throughput through the check matrix thereof.

SUMMARY

To provide an FEC manner which is not only applicable to a high-speed optical transmission system but also meets the requirements of high-gain performance and high throughput, embodiments of the present invention provide a coding and decoding method, apparatus, and system for forward error correction. The technical solutions are as follows:

In one embodiment, a coding method for forward error correction is provided. In this example, the method includes determining check matrix parameters of time-varying periodic low density parity check (LDPC) convolutional code according to performance of a transmission system, complexity of the transmission system, and a synchronization manner for code word alignment, and constructing a quasi-cyclic low density parity check (QC-LDPC) check matrix according to the determined check matrix parameters. The method further includes obtaining a check matrix ($H_c$) of the time-varying periodic LDPC convolutional code according to the QC-LDPC check matrix, and de-blocking, according to requirements of the $H_c$, data to be coded. The method further includes coding data of each sub-block according to the $H_c$ to obtain multiple code words of the LDPC convolutional code, and adding the multiple code words of the LDPC convolutional code in a data frame and sending the data frame.

In another embodiment, a decoding method for forward error correction is provided. In this example, the method includes receiving a data frame containing multiple low density parity check (LDPC) convolutional code words. The multiple code words of the LDPC convolutional code are obtained by performing coding according to a check matrix ($H_c$) of time-varying periodic LDPC convolutional code. The $H_c$ is obtained according to a quasi-cyclic low density parity check (QC-LDPC) check matrix. The method further includes obtaining the $H_c$ that is used when the multiple code words of the LDPC convolutional code are obtained by performing coding, determining the correspondence between the multiple code words of the LDPC convolutional code and the $H_c$, and decoding the multiple code words of the LDPC convolutional code according to the correspondence.

In yet another embodiment, a coding apparatus for forward error correction is provided. In this example, the coding apparatus includes a determining module, configured to determine check matrix parameters of time-varying periodic low density parity check (LDPC) convolutional code according to performance of the transmission system, complexity of a transmission system, and a synchronization manner for code word alignment. The coding apparatus further includes a construction module, configured to construct, a quasi-cyclic low density parity check (QC-LDPC) check matrix according to the check matrix parameters determined by the determining module, and to obtain a check matrix ($H_c$) of the time-varying periodic LDPC convolutional code according to the QC-LDPC check matrix. The coding apparatus further includes a coding module, configured to de-block, according to requirements of the $H_c$ obtained by the construction module, data to be coded, and to code data of each sub-block according to the $H_c$ to obtain multiple code words of the LDPC convolutional code. The coding apparatus further includes a sending module, configured to add the multiple code words of the LDPC convolutional code obtained by the coding module through coding in a data frame and to send the data frame.

In yet another embodiment, a decoding apparatus for forward error correction is provided. In this example, the decoding apparatus includes a receiving module, configured to receive a data frame containing multiple low density parity check (LDPC) convolutional code words. The multiple code words of the LDPC convolutional code are obtained by performing coding according to a check matrix ($H_c$) of time-varying periodic LDPC convolutional code. The $H_c$ is obtained according to a quasi-cyclic low density parity check (QC-LDPC) check matrix. The decoding apparatus further includes an obtaining module, configured to obtain the $H_c$ that is used when the multiple code words of the LDPC convolutional code are obtained by performing coding. The decoding apparatus further includes a determining module, configured to determine the correspondence between the multiple code words of the LDPC convolutional code in the data frame received by the receiving module and the $H_c$ obtained by the obtaining module The decoding apparatus further includes a decoding module, configured to decode the multiple code words of the LDPC convolutional code according to the correspondence determined by the determining module.

A system for forward error correction is further provided, including a coding apparatus for forward error correction and a decoding apparatus for forward error correction, where the coding apparatus for forward error correction is the same as the foregoing coding apparatus for forward error correction; and the decoding apparatus for forward error correction is the same as the foregoing decoding apparatus for forward error correction.

The benefits of the technical solutions provided in the embodiments of the present invention are as follows: A check matrix of the QC-LDPC is formed by cyclic shift matrixes, while the check characteristics of the cyclic shift may decrease the implementation complexity of the check significantly. Furthermore, the performance of LDPC convolutional code is better than that of LDPC block codes, and the performance of time-varying LDPC convolutional code is better than that of time-invariant LDPC convolutional code. Therefore, forward error correction performed by using time-varying periodic LDPC convolutional code with a QC-LDPC structure is not only applicable to a high-speed optical transmission system, but also meets the requirements of high-gain performance and high throughput.

BRIEF DESCRIPTION OF THE DRAWINGS

For a better understanding of the technical solutions in the embodiments of the present invention, the accompanying drawings for illustrating the embodiments are briefly described below. Apparently, the accompanying drawings in the following description illustrate only some embodiments of the present invention, and a person skilled in the art may derive other accompanying drawings from these accompanying drawings without creative efforts.

FIG. 14 is a flowchart of a decoding method for forward error correction provided by this disclosure;

FIG. 15 is a schematic diagram of the correspondence between code words and a check matrix ($H_c$) provided by this disclosure;

FIG. 20 is a flowchart of a decoding method for forward error correction provided by this disclosure;

FIG. 21 is a schematic diagram of the correspondence between code words and a check matrix ($H_c$) provided by this disclosure;

DETAILED DESCRIPTION OF ILLUSTRATIVE EMBODIMENTS

For a better understanding of the objectives, technical solutions, and advantages of the present invention, the embodiments of the present invention are described in further detail below with reference to the accompanying drawings.

Figure 1:
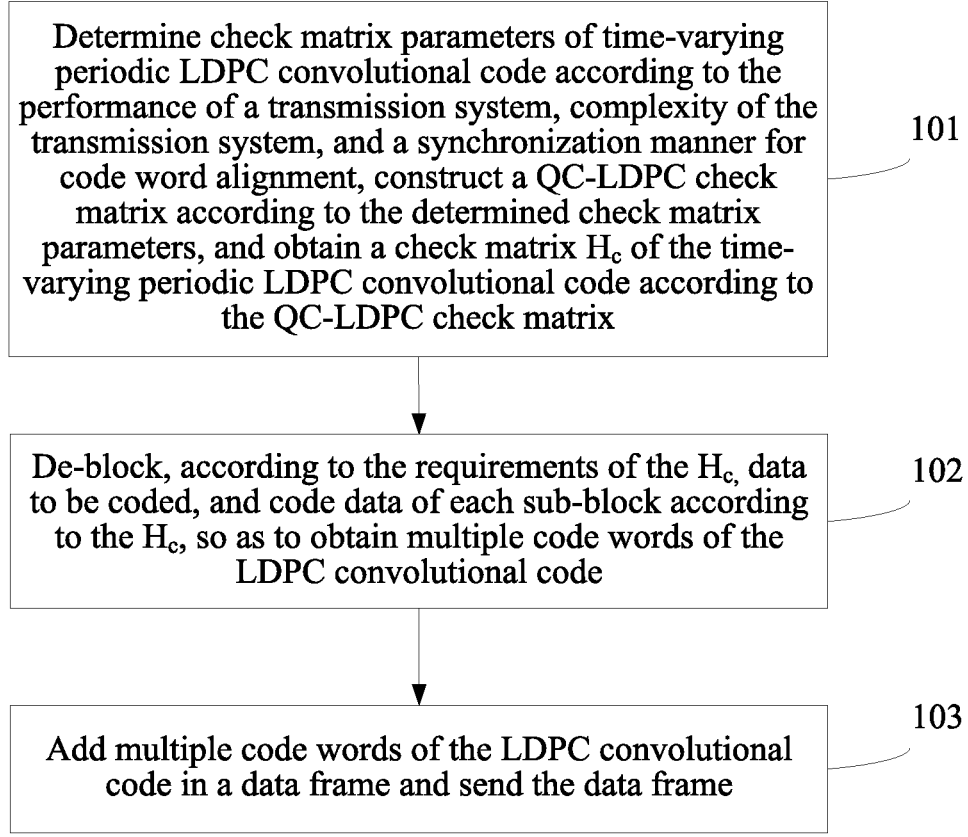
FIG. 1 is a flowchart of a coding method for forward error correction provided by this disclosure.

Embodiments provide a coding method for forward error correction. To be applicable to a high-speed optical transmission system and meet the requirements of high-gain performance and high throughput, in the method provided in an embodiment, time-varying periodic LDPC convolutional code is used in the coding process, and structural characteristics of a QC-LDPC check matrix are introduced in a check matrix ($H_c$) thereof. To facilitate the description, in an embodiment, the coding method for forward error correction provided in an embodiment is described by taking that a sending end in the optical transmission system sends coded data as an example. Referring to FIG. 1, the process of the method provided in an embodiment is as follows specifically:

101: Determine check matrix parameters of time-varying periodic LDPC convolutional code according to the performance of a transmission system, complexity of the transmission system, and a synchronization manner for code word alignment, construct a QC-LDPC check matrix according to the determined check matrix parameters, and obtain a check matrix ($H_c$) of the time-varying periodic LDPC convolutional code according to the QC-LDPC check matrix.

Figure 2:
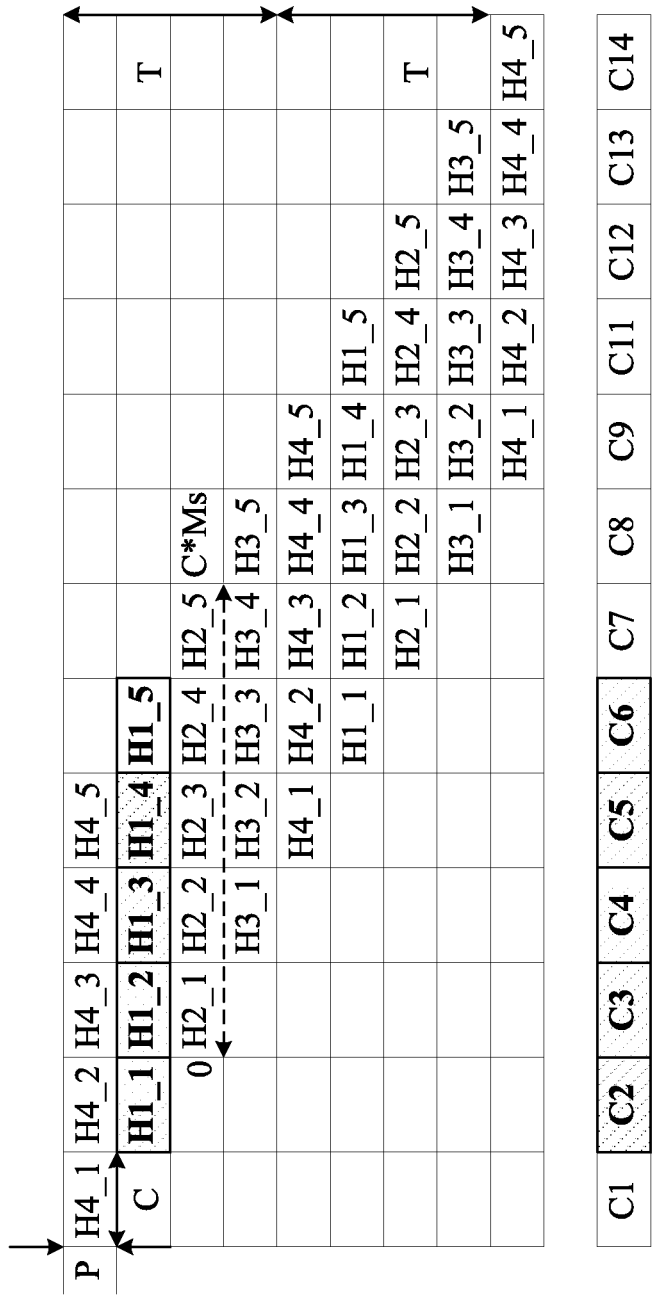
FIG. 2 is a schematic diagram of the correspondence between code words and a check matrix ($H_c$) provided by this disclosure.

For this step, an embodiment does not limit an implementation manner of constructing a check matrix ($H_c$). Before specific description is made on the construction manner of the matrix, an embodiment describes the $H_c$ first in detail by taking the correspondence between code words and the check matrix $H_c$ shown in FIG. 2 as an example. As shown in FIG. 2, a period of $H_c$ is T (that is, a repeat occurs every T layers of sub-matrixes), where each layer of sub-matrixes is formed by Ms PxC matrix blocks Hi_js, and Hi_j is formed by several cyclic shift matrixes. In other words, for the check matrix $H_c$ with a period of T, each layer of sub-matrixes are a check matrix of QC-LDPC block codes. It is assumed that a column weight of each layer of sub-matrixes in a manner of QC-LDPC check matrix is k, and a row weight thereof is λ. It may be seen that there are totally Ms*T Hi_j matrix blocks in the matrix $H_c$. Therefore, if the $H_c$ is to be constructed, the key is to determine each Hi_j.

To make the implementation easier, usually k=1, that is, PxCHi_j of is formed by C/P PxP unit cyclic shift matrixes. Therefore, C should be an integral multiple of P. In FIG. 2, Ms=5, T=4, and Ms is not equal to T. That is, a coded LDPC convolutional code word Ci in an embodiment and its front or back adjacent (Ms−1) code words in sequence or (Ms−1) code words at an interval following a rule are combined to form Ms QC-LDPC block code words, where the Ms QC-LDPC block code words each meet a check relationship at a layer in the $H_c$. For example, in FIG. 2, it is assumed that a current code word is C2, C2 and code words C3, C4, C5, and C6 before C2 are combined to form a QC-LDPC block code word, which meets a QC-LDPC check relationship of the $H_c$ at an H1 layer; meanwhile, (C3, C4, C5, C6, C7) are also combined into a QC-LDPC block code word, which meets a QC-LDPC check relationship at an H2 layer; likewise, (C4, C5, C6, C7, C8) is also a QC-LDPC block code word, which meets a QC-LDPC check relationship at a next layer. The rest may be deduced by analogy; after T time points (for example, T=4), the check relationship met by (C6, C7, C8, C9, C10) is at the H1 layer again.

In the correspondence between code words and the check matrix $H_c$ shown in FIG. 2, for a time-varying periodic LDPC convolutional code, the relationship between R (Rate, rate) and related parameters is: $R=(C-P)/C=(\lambda-Ms*k)/\lambda$, where C is a length of a code word generated during the coding, (C−P) bits (bit) currently input and front ($M_S$−1) code words are combined to form an information bit, and codes of a matrix at a layer in the current corresponding T layers of matrixes are used to generate a P-bit parity bit. The P-bit parity bit and the (C−P)-bit information bit are combined into a code word block with a length of C, and the code word block is sent. Ms code word blocks with a length of C are combined to commonly meet a check relationship in a form of QC-LDPC at a layer. Therefore, a constraint length (constraint length) of the time-varying periodic LDPC convolutional code is called C*Ms.

To sum up, when check matrix parameters of time-varying periodic LDPC convolutional code are determined according to the performance of the transmission system, the complexity of the transmission system, and the synchronization manner for code word alignment, the check matrix parameters include, but are not limited to, the rate R, the time-varying period T, the number Ms of sub-matrixes in the $H_c$ within each T, and the parity bit length P. A specific determining manner of the parameters may be obtained through the following steps:

1.11: Determine R, T and Ms according to the performance and complexity of the transmission system;

1.12: Determine the length C of each code word block according to the synchronization manner for code word alignment; and 1.13: Determine a parity bit length P according to R and C.

After the check matrix parameters are determined, a QC-LDPC check matrix may be constructed by performing the following steps according to the determined check matrix parameters; and the $H_c$ is obtained according to the QC-LDPC check matrix:

1.21: Construct a QC-LDPC check matrix with a preset girth according to T, $M_S$, C, and P;

1.22: Split the QC-LDPC check matrix into Ms sub-matrixes based on columns, and into T sub-matrixes based on rows, so as to obtain Ms*T sub-matrixes; and 1.23: Fill, in a preset order, the Ms*T sub-matrixes into Ms*T positions in each period, so as to obtain the $H_c$.

Because an error floor (error floor) lower than 1e-15 may be ensured at the same time of achieving a throughput of 100 Gbit/s when T=Ms=4, an embodiment exemplifies the process of constructing the $H_c$ by taking T=Ms=4 as an example.

First, an embodiment does not limit a manner of determining R, T and Ms, and in actual application, R, T and Ms may be determined in combination with specific performance and complexity of the transmission system. Another parameter C among check matrix parameters may be determined according to the synchronization manner for code word alignment; for details, refer to the description about a manner of adding an identity signal in the follow-up step 103, and the details are not described herein. After the length C of each code word block is determined, a parameter P is determined according to a relationship between R, C, and P. As described in the foregoing analysis, the relationship between R, C, and P is $R=(C-P)/C=(\lambda-Ms*k)/\lambda$.

Figures 3, 4:
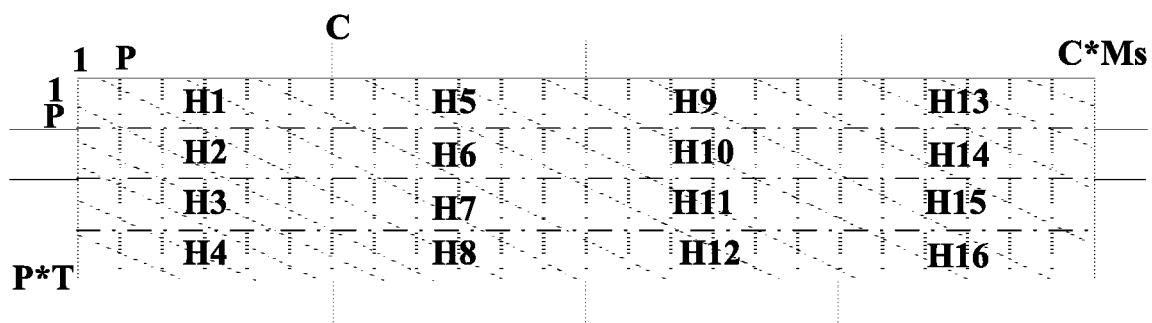
FIG. 3 is a schematic diagram of a QC-LDPC block code matrix provided by this disclosure.
FIG. 4 is a schematic diagram of a check matrix ($H_c$) of a type of time-varying periodic LDPC convolutional code provided by this disclosure.

Second, Ms*T matrix blocks with a size of PxC are needed in total to construct the $H_c$, so an embodiment adopts a manner in which a QC-LDPC check matrix $H_b$ with a girth (girth) greater than 6 is constructed by using a random construction method. The $H_b$ is specifically shown in FIG. 3. Definitely, when a QC-LDPC check matrix with a preset girth is constructed, in addition to the random construction method, other universal construction methods such as geometric construction method and algebraic construction method may be used. An embodiment does not limit a manner of constructing a QC-LDPC check matrix with a preset girth. Herein, that the QC-LDPC check matrix $H_b$ with a girth (girth) greater than 6 is constructed by using the random construction method is taken an example. After the QC-LDPC check matrix $H_b$ shown in FIG. 3 is obtained, along a boundary of a cyclic shift matrix, the $H_b$ is split into Ms sub-matrixes in a column direction and split into T sub-matrixes in a row direction. Therefore, the $H_b$ may provide Ms*T sub-matrixes in total.

Figure 5:
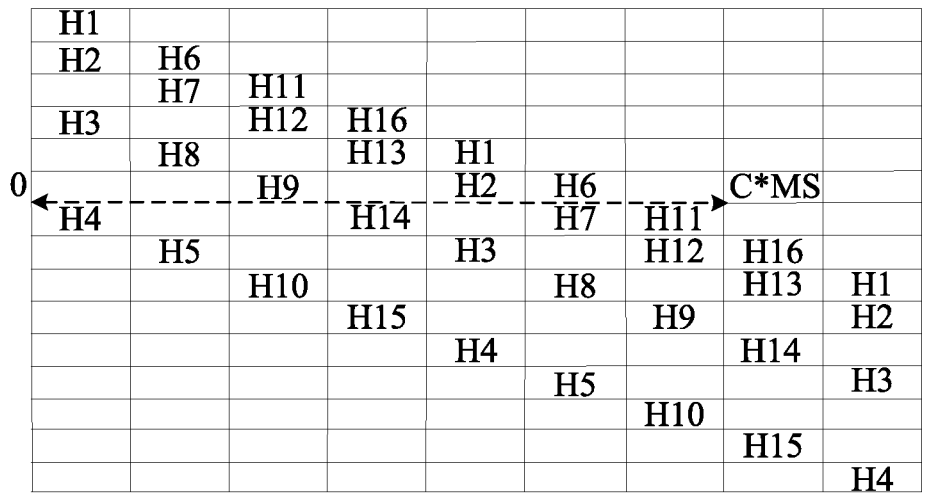
FIG. 5 is a schematic diagram of a check matrix ($H_c$) of another type of time-varying periodic LDPC convolutional code provided by this disclosure.

Finally, the split Ms*T small matrix blocks are filled in an order (or filled randomly) into Ms*T positions of the check matrix $H_c$ of the time-varying periodic LDPC convolutional code in each period. As shown in FIG. 4, the current 16 small matrix blocks are used to form the $H_c$, where T and Ms are equal to 4. For a case in which T is not equal to Ms, the construction method is the same. As shown in FIG. 5, when T is equal to 4 and Ms is equal to 7, all-zero matrixes are filled into specific positions, that is, all-zero matrixes are filled into positions corresponding to rows 3, 4, and 6 in a first column, rows 4, 6, and 7 in a second column, rows 5, 7, and 8 in a third column, rows 6, 8, and 9 in a fourth column, rows 7, 9, and 10 in a fifth column, rows 8, 10, and 11 in a sixth column, rows 9, 11, and 12 in a seventh column, rows 10, 12, and 13 in an eighth column, and rows 11, 13, and 14 in a ninth column in FIG. 5, and 16 small matrix blocks may still be used to form the $H_c$ by filling.

102: De-block, according to the requirements of the $H_c$ data to be coded, and code data of each sub-block according to the $H_c$ so as to obtain multiple code words of the LDPC convolutional code.

An embodiment does not limit specific data to be coded, where the data to be coded in the optical transmission system may be data output by an OTU (Optical channel Transport Unit, optical channel transport unit) Framer (OTU framing module). After the $H_c$ is determined, for the manner of coding data of each sub-block according to the $H_c$, refer to the existing LDPC coding manner, which is not specifically limited by an embodiment.

103: Add multiple code words of the LDPC convolutional code in a data frame and send the data frame.

For the step, an embodiment does not limit a manner of adding the multiple code words of the LDPC convolutional code in the data frame. Because coded data is sent through the optical transmission system, the method provided in an embodiment also supports operations such as interleaving the coded data, and modulating the coded data through a high-order modulator. Because of the time-varying period characteristics of the LDPC convolutional code, after a receiving end receives coded data, the correspondence between the multiple LDPC code words and the $H_c$ may be determined according to a check relationship met by the time-varying periodic LDPC convolutional code themselves, so that a judgment is made according to the correspondence to implement the decoding. Definitely, if operations such as interleaving and modulation are performed when the coded data is sent, the demodulation and de-interleaving also need to be performed first on received data at the receiving end.

Preferably, to facilitate the receiving end to determine the correspondence between the multiple LDPC code words and the $H_c$ in the follow-up operation, that is, to determine a synchronization manner for code word alignment so as to perform the decoding correctly, before the multiple code words of the LDPC convolutional code are added in the data frame and the data frame is sent, the method provided in an embodiment further includes: adding an identity signal in the data frame, where the identity signal is used to identify the correspondence between the multiple code words of the LDPC convolutional code and the $H_c$, so that the receiving end identifies the correspondence between the multiple code words of the LDPC convolutional code and the $H_c$ according to the identity signal, and decodes the multiple LDCP convolutional code words according to the $H_c$.

An embodiment does not specifically limit the correspondence between the multiple code words of the LDPC convolutional code and the $H_c$, which may include, but is not limited to, an initial position of code words in the data frame, the number of layers of the corresponding $H_c$ matrix, and the number of paths of coded data flows. An embodiment also does not specifically limit manners of adding an identity signal. The manners include, but are not limited to, the following three manners:

First manner: An FAS (Frame Alignment Signal, frame alignment signal) within the frame header of the data frame is added in the data frame as an identity signal.

Figure 6:
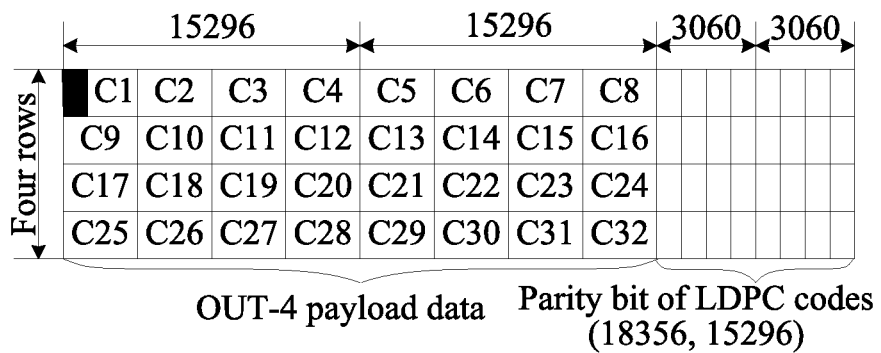
FIG. 6 is a schematic structural diagram of a data frame provided by this disclosure.

For the manner, the frame header FAS of OTU-4 is one block per frame, so in order to use the FAS as an identity signal, LDPC convolutional code words which are integral multiples of T need to be put in one OTU-4 frame in the method provided in the embodiment, as shown in FIG. 6. In FIG. 6, wide cells C1 to C32 in the left are OUT-4 payload data, corresponding to information bits of the code words, and narrow cells in the right are parity bits of LDPC codes.

In addition, the size of an OTU frame is fixed, that is, a position interval of FASs is fixed. Therefore, for the manner in which the code word synchronization is performed by using an FAS within the frame header of the OTU, the value of C is determined by the size of the OTU frame.

Second manner: A training sequence used at the time of transmitting a data frame is added in the data frame as an identity signal.

Figure 7:
FIG. 7 is a schematic structural diagram of a data flow provided by this disclosure.

For the implementation manner in which a training sequence (Training Sequence) used by an Equalizer (equalizer) module in the coherent optical transmission system is used as an identity signal, if the data flow structure in which a training sequence is used to perform the equalization is shown in FIG. 7, TS are active training sequences, black blocks indicate passive training sequences, an interval between two active training sequences is a training sequence period, and a length of a data block DATA in each training sequence period is 2528 bits. In each period, data bits excluding data bits of the training period are 2528 bits in total, that is, a length of data in data blocks in each training sequence period is 2528 bits which do not include a training sequence TS.

The Equalizer is a module independent of FEC and a training sequence period used by the Equalizer has been designed in advance. Therefore, for the manner in which a training sequence is used as an identity signal to perform the code word synchronization, the size of C depends on an interval period of the TS, and a relationship between the value of C and the TS period may be a relationship of positive rational multiple (for example, integral multiple or fractional multiple).

Third manner: An identity of the correspondence between code words and the $H_c$ is inserted at an initial position of the code words in the data frame, and the inserted identity of the correspondence is used as an added identity signal.

Figures 8, 9:
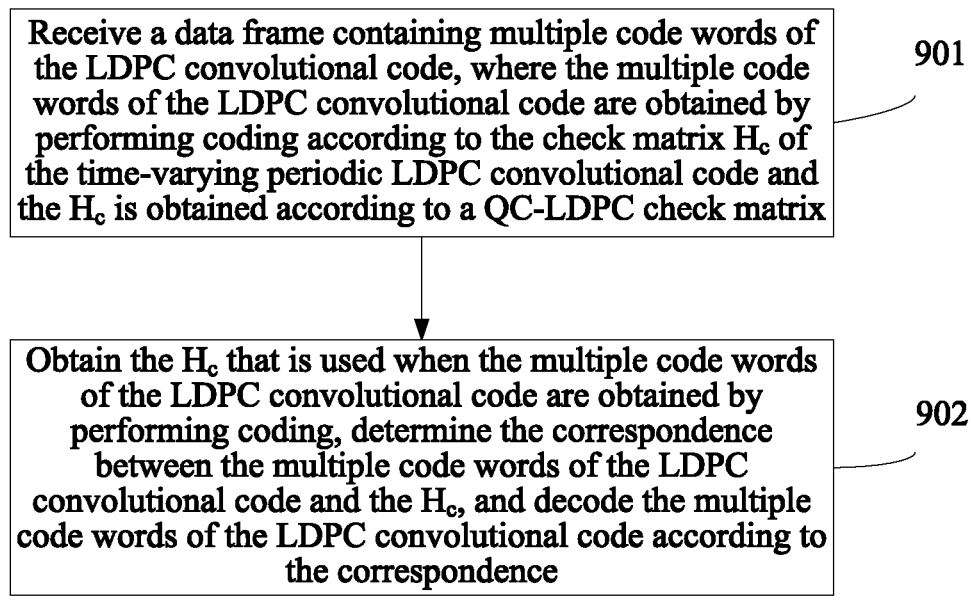
FIG. 8 is a schematic structural diagram of another data flow provided by this disclosure.
FIG. 9 is a flowchart of a decoding method for forward error correction provided by this disclosure.

For the manner, after the LDPC convolutional code is coded, an additional bit is inserted at an initial position of every C*T code words to identify the correspondence, that is, an identity ID is added before the code words meeting the same check relationship at the $H_c$ layer. In this manner, the receiving end determines an initial position of a code word block and a corresponding layer of the check matrix $H_c$ by detecting an identity signal. A data flow structure corresponding to this manner is shown in FIG. 8. In the synchronization manner for code word alignment, the size of C may be determined flexibly according to the complexity and performance of the system.

The similarity between this manner and the manner in which no identity signal is added is that the identity signal does not produce constraint conditions for the check matrix $H_c$ of the LDPC convolutional code. In the manner in which no identity signal is added, blind synchronization is performed by directly using the check relationship of the LDPC convolutional code; however, in the manner, an identity signal is inserted at a corresponding initial position of the code words after the LDPC convolutional code is coded.

It should be noted that it is unnecessary to construct an $H_c$ each time when the forward error correction is performed according to the method provided in an embodiment. That is, after the $H_c$ is obtained by performing the foregoing step 101 at the first time, the constructed $H_c$ may be directly used to perform the coding when the forward error correction is performed again, thereby improving the coding efficiency.

In the method provided in an embodiment, the forward error correction is performed by using time-varying periodic LDPC convolutional code with a QC-LDPC structure. A check matrix of the QC-LDPC is formed by cyclic shift matrixes, and the check characteristics of the cyclic shift may decrease the implementation complexity of the check significantly. Furthermore, the performance of LDPC convolutional code is better than that of LDPC block codes, and the performance of time-varying LDPC convolutional code is better than that of time-invariant LDPC convolutional code. Therefore, the method provided in an embodiment is not only applicable to the high-speed optical transmission system, but also meets the requirements of high-gain performance and high throughput.

For the data coded by using the coding method for forward error correction, an embodiment provides a decoding method for forward error correction. In this method, by determining the correspondence (that is, a synchronization manner for code word alignment) between multiple code words of the LDPC convolutional code and an $H_c$ in the coded data and decoding the coded data according to the determined correspondence, the decoding method for forward error correction is described from a perspective that a receiving end in an optical transmission system receives the coded data. Referring to FIG. 9, the process of the method provided in an embodiment is as follows specifically:

901: Receive a data frame containing multiple code words of the LDPC convolutional code, where the multiple code words of the LDPC convolutional code are obtained according to the coding of the check matrix $H_c$ of the time-varying periodic LDPC convolutional code and the $H_c$ is obtained according to a QC-LDPC check matrix.

902: Obtain the $H_c$ that is used when the multiple code words of the LDPC convolutional code are obtained by performing coding, determine the correspondence between the multiple code words of the LDPC convolutional code and the $H_c$, and decode the multiple code words of the LDPC convolutional code according to the correspondence.

Before the coding, the $H_c$ is obtained by using the following manners: determining R, T, and Ms according to the performance and complexity of the transmission system, where R is a rate, T is a time-varying period, and Ms is the number of sub-matrixes in the $H_c$ in each T; determining a length C of each code word block according to the synchronization manner for code word alignment, and determining a parity bit length P according to R and C; constructing a quasi-cyclic QC-LDPC check matrix with a preset girth according to T, $M_S$, C, and P; splitting the QC-LDPC check matrix into Ms sub-matrixes based on columns, and into T sub-matrixes based on rows, so as to obtain Ms*T sub-matrixes; and filling, in a preset order, the Ms*T sub-matrixes into Ms*T positions in each period, so as to obtain the H.

It should be noted that, for the process of obtaining the $H_c$ according to the foregoing steps, refer to the description about constructing the $H_c$, and the details are not described herein again.

Furthermore, the determining the correspondence between the multiple code words of the LDPC convolutional code and the $H_c$ includes: shifting the multiple code words of the LDPC convolutional code, and calculating a syndrome $S=r*H_c^t$ once in each shift, and until the maximum number of check relationships is met, obtaining the correspondence between the multiple code words of the LDPC convolutional code and the $H_c$, where r is a code stream containing multiple code words of the LDPC convolutional code.

Preferably, an identity signal used to identify the correspondence between the multiple code words of the LDPC convolutional code and the $H_c$ is added in the data frame.

The determining the correspondence between the multiple code words of the LDPC convolutional code and the $H_c$ includes: identifying an identity signal added in the data frame, and determining the correspondence between the multiple code words of the LDPC convolutional code and the $H_c$ according to the identity signal.

In one example, the identity signal is an FAS within the frame header of the data frame, and the identifying the identity signal added in the data frame and determining the correspondence between the multiple code words of the LDPC convolutional code and the $H_c$ according to the identity signal includes: identifying the FAS within the frame header of the data frame, and determining the correspondence between the multiple code words of the LDPC convolutional code and the $H_c$ according to the frame header FAS of the data frame.

In another example, the identity signal is a training sequence used at the time of transmitting the data frame, and the identifying the identity signal added in the data frame and determining the correspondence between the multiple code words of the LDPC convolutional code and the $H_c$ according to the identity signal includes: identifying the training sequence used at the time of transmitting the data frame, and identifying the correspondence between the multiple code words of the LDPC convolutional code and the $H_c$ according to the training sequence.

In yet another example, the identity signal is an identity of the correspondence between the code words inserted in an initial position of the code words in the data frame and the $H_c$, and the identifying the identity signal added in the data frame and determining the correspondence between the multiple code words of the LDPC convolutional code and the $H_c$ according to the identity signal includes: identifying the identity of the correspondence between the code words and the $H_c$, and determining the correspondence between the multiple code words of the LDPC convolutional code and the $H_c$ according to the identity of the correspondence.

By determining the correspondence between the code words and the check matrix in the coded data and decoding received coded data according to the determined correspondence, the method provided in an embodiment is not only applicable to a high-speed optical transmission system but also meets the requirements of high-gain performance and high throughput.

Figure 10:
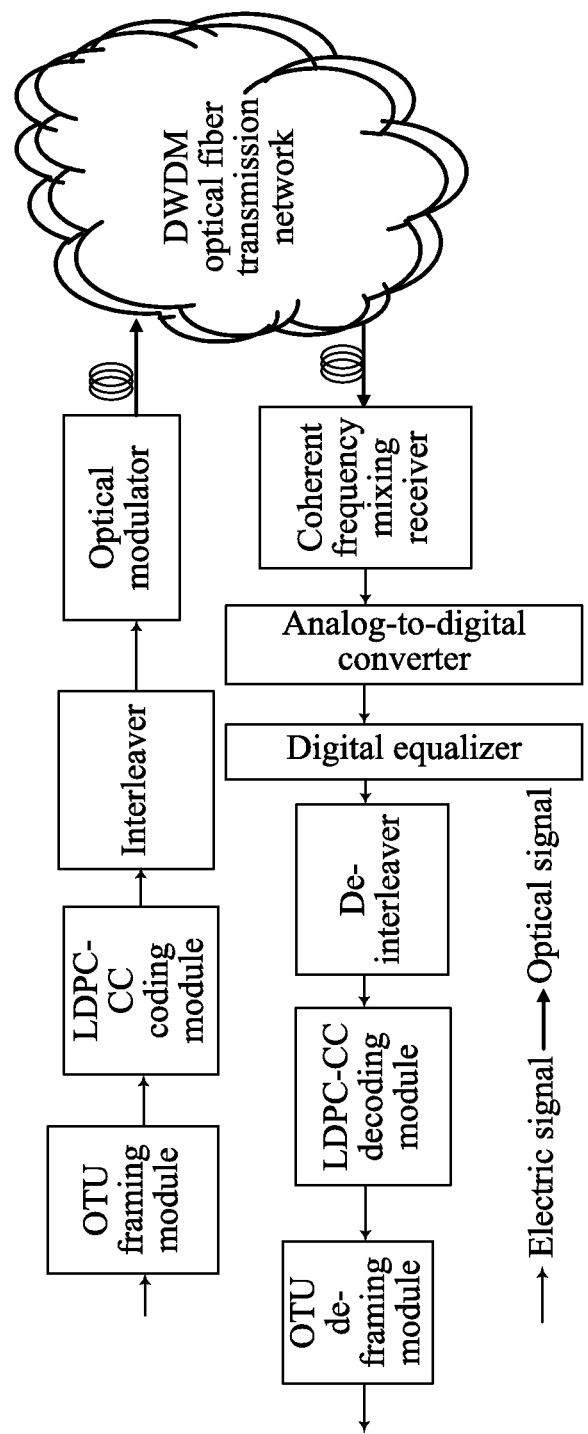
FIG. 10 is a schematic structural diagram of an optical transmission system provided by this disclosure.
Figure 11:
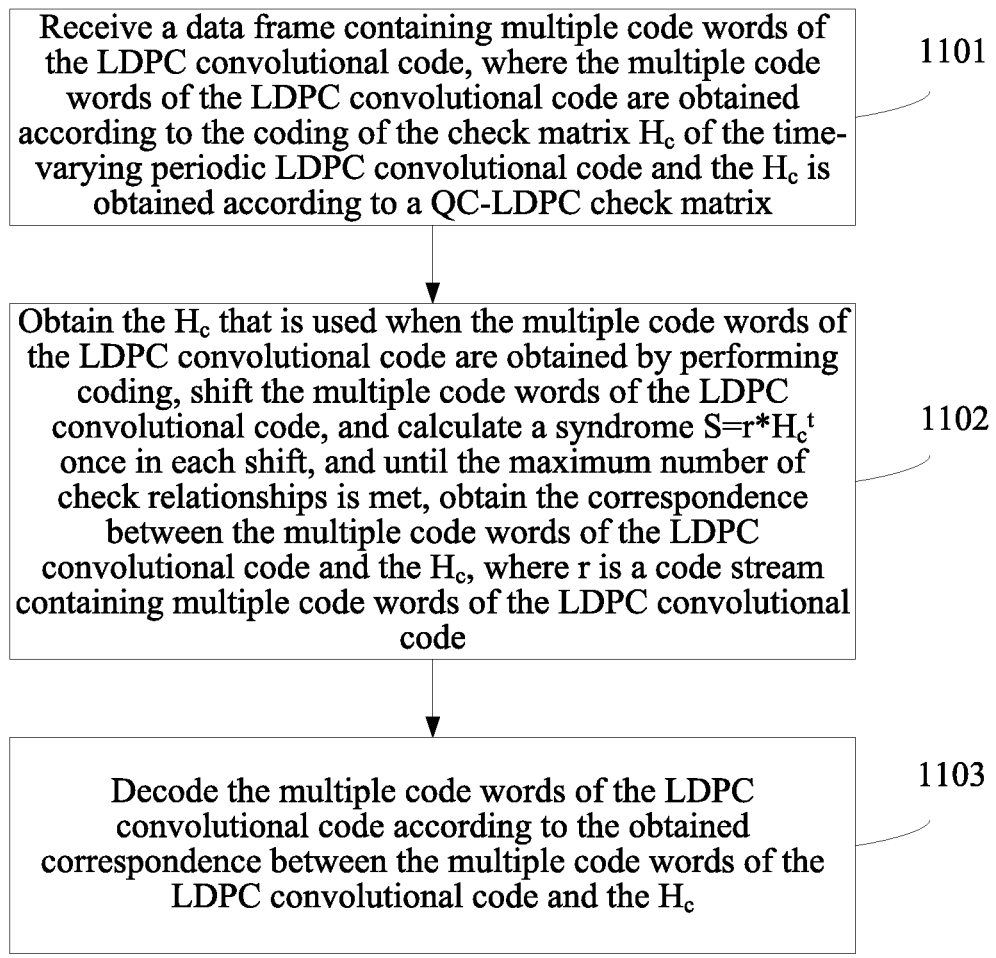
FIG. 11 is a flowchart of a decoding method for forward error correction provided by this disclosure.

For the case in which no identity signal is, an embodiment provides a decoding method for forward error correction. In the method, by using a check relationship met by time-varying periodic LDPC convolutional code itself, a synchronization manner for code word alignment is determined, so as to decode received coded data. In this case, a structure of an optical transmission system is as shown in FIG. 10. After data output by an OTU framing module is coded by an LDPC-CC (Convolutional Code, convolutional code) coding module, interleaved by an interleaver and modulated by an optical modulator, the data is transmitted to a DWDM (Dense Wavelength Division Multiplexing, dense wavelength division multiplexing) optical fiber transmission network. Referring to FIG. 11, the process of the method provided in an embodiment is as follows specifically:

1101: Receive a data frame containing multiple code words of the LDPC convolutional code, where the multiple code words of the LDPC convolutional code are obtained according to the coding of the check matrix $H_c$ of the time-varying periodic LDPC convolutional code and the $H_c$ is obtained according to a QC-LDPC check matrix.

An embodiment does not limit content of a specific received data frame, and the LDPC convolutional code words in the data frame may be obtained by coding by using embodiment methods provided by this disclosure, that is, the LDPC convolutional code words may be obtained according to the coding of the check matrix $H_c$ of the time-varying periodic LDPC convolutional code, and the $H_c$ is obtained according to the QC-LDPC check matrix. Further details about the process of constructing the $H_c$ are provided above.

1102: Obtain the $H_c$ that is used when the multiple code words of the LDPC convolutional code are obtained by performing coding, shift the multiple LDPC convolutional code words, and calculate a syndrome $S=r*H_c^t$ once in each shift, and until the maximum number of check relationships is met, obtain the correspondence between the multiple code words of the LDPC convolutional code and the $H_c$, where r is a code stream containing multiple code words of the LDPC convolutional code.

Figure 12:
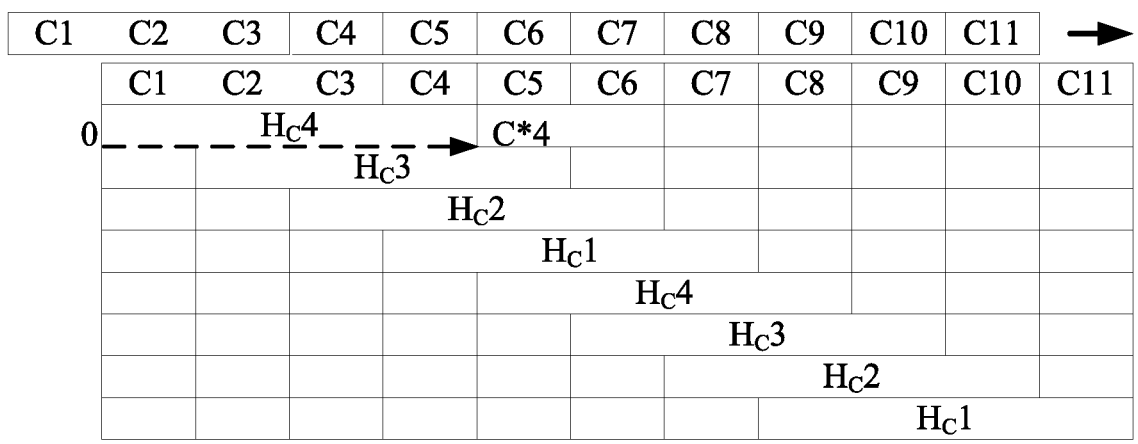
FIG. 12 is a schematic diagram of the correspondence between code words and a check matrix ($H_c$) provided by this disclosure.

For this step, because only the information of the code words themselves is used and no additional identity signal is needed, a constraint length C*Ms of the LDPC convolutional code is not determined by an identification function. The obtained $H_c$ is the $H_c$ adopted during embodiment coding techniques, and the $H_c$ is obtained through construction before the coding. Therefore, for a specific construction manner of the $H_c$, refer to the related descriptions above. If the received data flow is r=(C1, C2, C3, . . . ), the bit shift is performed on the received data flow r. As shown in FIG. 12, 0 is shifted to (c*T−1)bit in total, and the syndrome $S=r*H_c^t$ is calculated once for each 1 bit shift. When the maximum number of the check relationships is met, that is, the number of 0 in the syndrome s is the maximum, it indicates that the code word data flow and the $H_c$ are matched exactly in the relationship of the check layer, and the matching result is shown by a code word flow below a black arrow in FIG. 12.

1103: Decode the multiple code words of the LDPC convolutional code according to the obtained correspondence between the multiple code words of the LDPC convolutional code and the $H_c$.

Specifically, an embodiment does not limit a specific decoding process. In the actual application, after the correspondence between the multiple code words of the LDPC convolutional code and the $H_c$ is determined in step 1102, the step may be used to form front and back code words to those with a length of constraint code words according to the obtained correspondence between the multiple code words of the LDPC convolutional code and the $H_c$, and then soft-decision decoding is performed according to the check relationship of the corresponding $H_c$ layers. For example, as shown in FIG. 12, (C8, C7, C6, C5)*$H_{c4}$=0, (C9, C8, C7, C6)*$H_{c3}$=0, (C10, C9, C8, C7)*$H_{c2}$=0, and (C11, C10, C9, C8)*$H_{c1}$=0. Furthermore, with reference to the schematic structural diagram of the optical transmission system shown in FIG. 10, the receiving end for receiving coded data in the optical transmission system may further perform the processes such as analog-to-digital conversion, digital equalization, and de-interleaving on the received data before decoding the received coded data, and may further output the decoded data into the OTU de-framing module after the decoding.

In the method provided in an embodiment, the correspondence between the code words and the check matrix is determined by using a check relationship met by the time-varying periodic LDPC convolutional code, and received coded data is decoded according to the determined correspondence. Therefore, the method is not only applicable to the high-speed optical transmission system but also meets the requirements of high-gain performance and high throughput.

Figure 13:
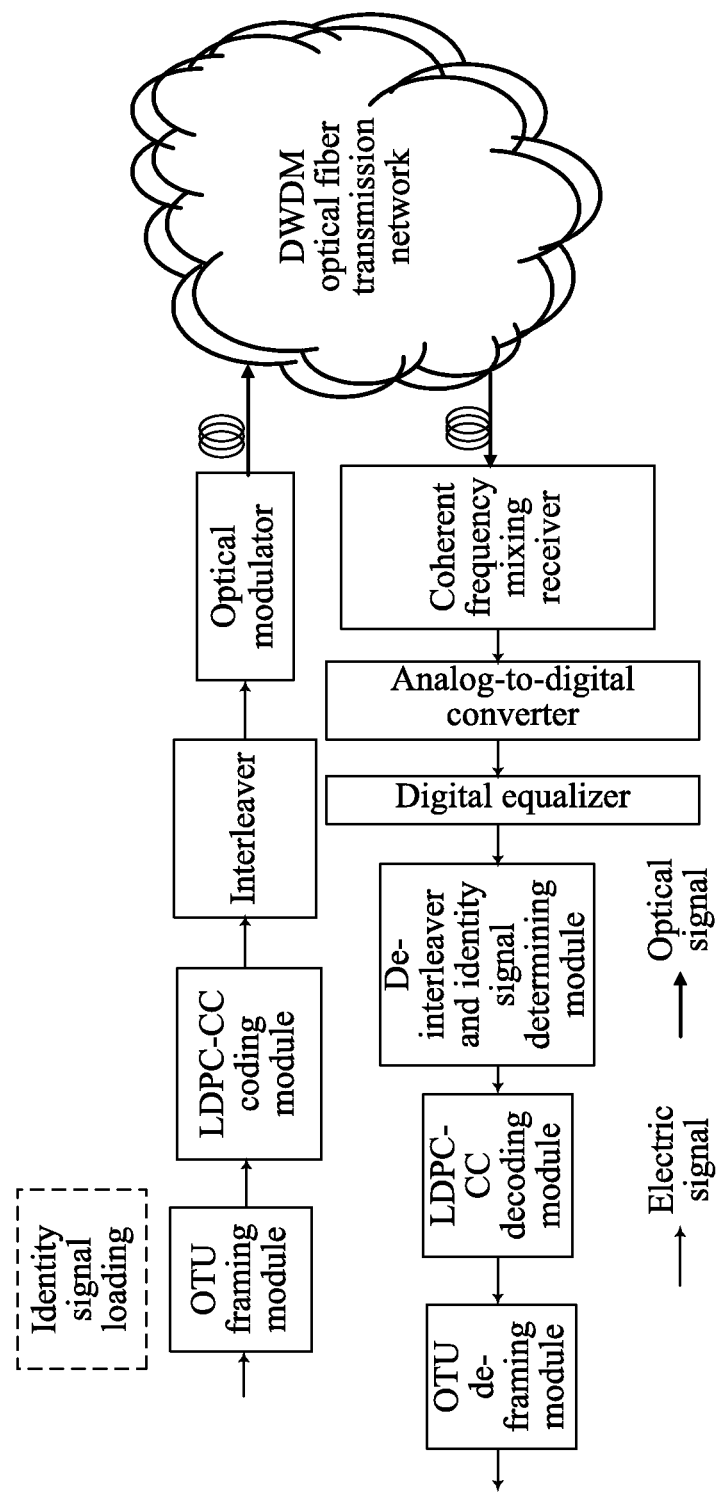
FIG. 13 is a schematic structural diagram of an optical transmission system provided by this disclosure.

For the case in which an FAS within a frame header of a data frame is added in the data frame as an identity signal, an embodiment provides a decoding method for forward error correction. In the method, by identifying the frame header FAS of the data frame, the correspondence between code words and a check matrix (Hc) (that is, a code word alignment manner) is determined, so as to implement the decoding on received coded data. In this case, a structure of an optical transmission system is shown in FIG. 13. The identity signal is added in an OTU Framer, and after the coding, interleaving, and optical modulation, the data is transmitted into a DWDM optical fiber transmission network. Referring to FIG. 14, the process of the method provided in an embodiment is as follows specifically:

1401: Receive a data frame containing multiple code words of the LDPC convolutional code, where the multiple code words of the LDPC convolutional code are obtained according to the coding of the check matrix Hc of the time-varying periodic LDPC convolutional code, the Hc is obtained according to a QC-LDPC check matrix, and the frame header FAS of the data frame used to identify the correspondence between the multiple code words of the LDPC convolutional code and the Hc is added in the data frame.

Specifically, an embodiment does not limit the content of a specific received data frame, and the LDPC convolutional code words in the data frame may be obtained by performing the coding according to embodiment methods provided by this disclosure, that is, the LDPC convolutional code words may be obtained according to the coding of the check matrix Hc of the time-varying periodic LDPC convolutional code, and the Hc is also obtained according to the QC-LDPC check matrix. For details about the process of constructing the Hc, refer to descriptions provided above. Because of time-varying period characteristics of the LDPC convolutional code words, the FAS within the frame header of the data frame used to identify the correspondence between the multiple code words of the LDPC convolutional code and the Hc is added in the received data frame. In a follow-up step, the decoding is implemented through the identification of the FAS within the frame header of the data frame.

1402: Obtain the Hc that is used when the multiple code words of the LDPC convolutional code are obtained by performing coding, identify the frame header FAS of the data frame, and determine the correspondence between the multiple code words of the LDPC convolutional code and the Hc according to the FAS within the frame header of the data frame.

For this step, an embodiment does not limit the manner of identifying the frame header FAS of the data frame. With reference to a data frame structure shown in FIG. 6, because an integral number of LDPC convolutional code words of T are put into one OTU-4 frame when an identity signal is added, a constraint length C*T=18360 (that is, C=4590) of LDPC convolutional code is selected in consideration of other factors such as the complexity, according to the constraints on the identity signal. If an overhead of 20% is selected, C/P=6; P=765, so the time-varying LDPC convolutional code check matrix Hc with a period of 4 is constructed.

The check relationship in the decoding is shown in FIG. 15. When a data flow r is received, by identifying a code word C1 containing a frame header FAS of the OTU, it is known that C1 and three front code words C0, C-1, and C-2 are combined to meet the check of Hc3. The correspondence between the following code words and check layers of Hc is obtained in sequence accordingly.

1403: Decode the multiple code words of the LDPC convolutional code according to the determined correspondence between the multiple code words of the LDPC convolutional code and the Hc.

Specifically, an embodiment does not limit a specific decoding process. In the actual application, after the correspondence between the multiple code words of the LDPC convolutional code and the Hc is determined in step 1402, the step may be used to form front and back code words to those with a length of constraint code words according to the obtained correspondence between the multiple code words of the LDPC convolutional code and the Hc, and then soft-decision decoding is performed according to the check relationship of the corresponding Hc layers. For example, as shown in FIG. 15, (C8, C7, C6, C5)*Hc4=0, (C9, C8, C7, C6)*Hc3=0, (C10, C9, C8, C7)*Hc2=0, and (C11, C10, C9, C8)*Hc1=0. Furthermore, with reference to the schematic structural diagram of the transmission system shown in FIG. 13, the receiving end for receiving coded data in the optical transmission system may further perform the processes such as analog-to-digital conversion, digital equalization, and de-interleaving before decoding the received coded data, and may further output the decoded data into the OTU de-framing module after the decoding.

In the method provided in an embodiment, the correspondence between the code words and the check matrix Hc is determined by identifying the FAS within the frame header of the data frame, so as to implement the decoding of received coded data. Therefore, the method is not only applicable to a high-speed optical transmission system but also meets the requirements of high-gain performance and high throughput.

Figure 16:
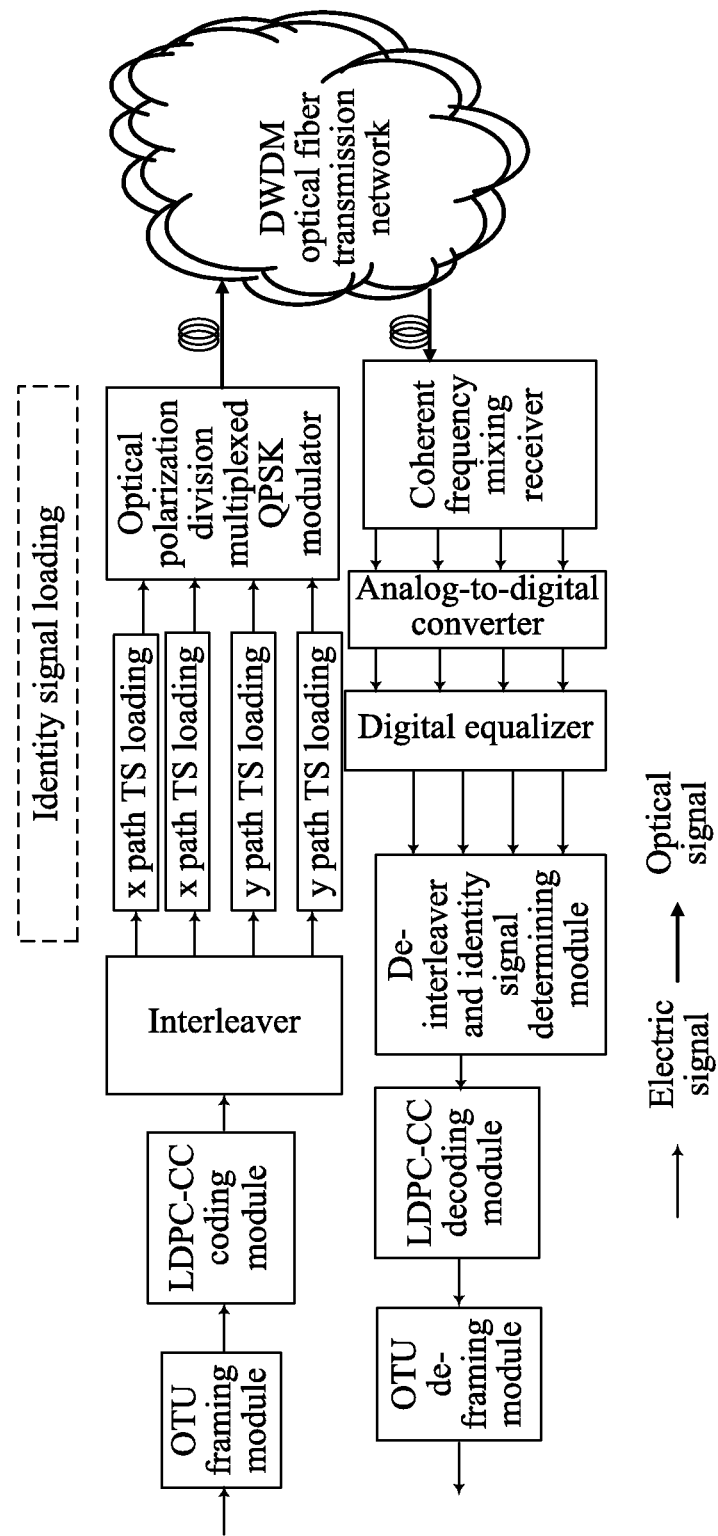
FIG. 16 is a schematic structural diagram of an optical transmission system provided by this disclosure.
Figures 17, 18:
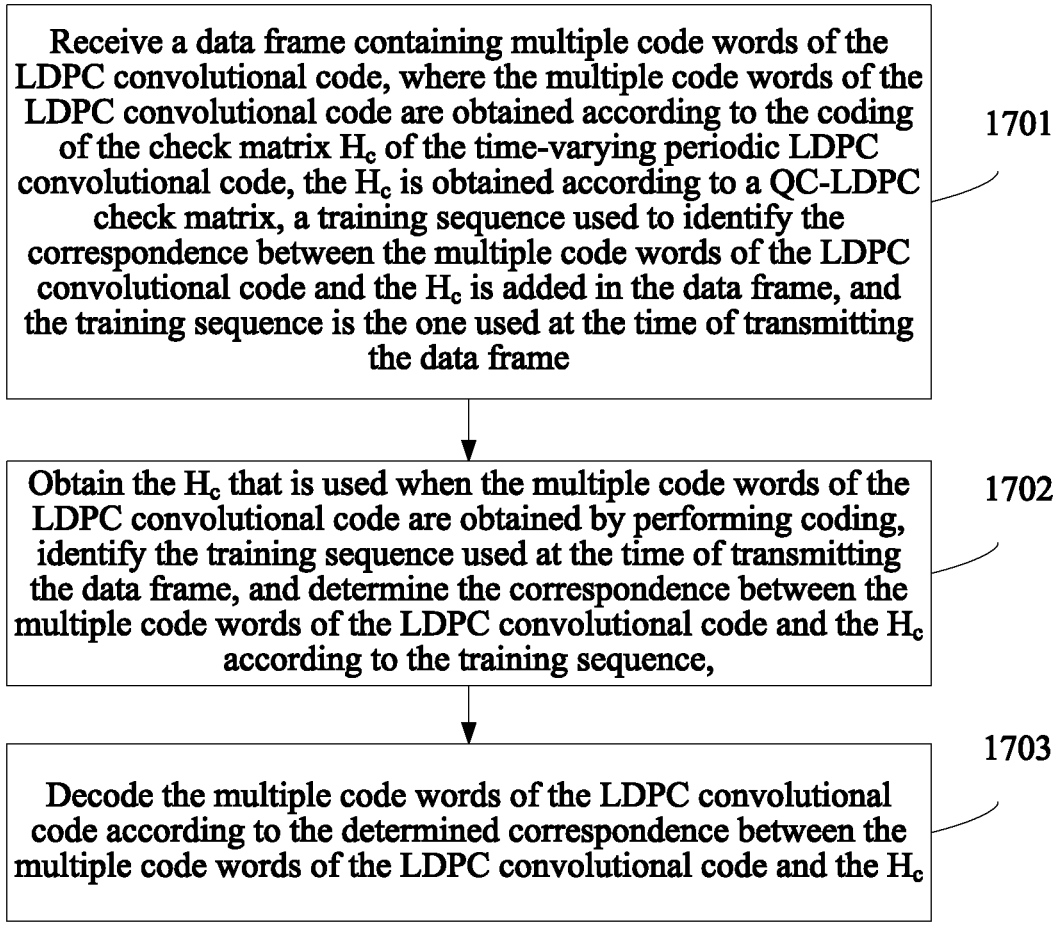
FIG. 17 is a flowchart of a decoding method for forward error correction provided by this disclosure.
FIG. 18 is a schematic diagram of the correspondence between code words and a check matrix ($H_c$) provided by this disclosure.

For the case in which a training sequence used at the time of transmitting a data frame is added in the data frame as an identity signal, an embodiment provides a decoding method for forward error correction. In the method, by identifying the training sequence added in the data frame and used at the time of transmitting the data frame, the correspondence between code words and a check matrix (Hc) is determined, so as to implement the decoding of received coded data. In this case, a structure of an optical transmission system is shown in FIG. 16. After the coding, interleaving, TS loading, and modulation, data output by the OTU framing module is transmitted into a DWDM optical fiber transmission network. For training sequences, PDM-QPSK (Polarization Division Multiplexed QPSK, polarization division multiplexed QPSK modulation format) is used, and for an x polarization branch and a y polarization branch, training sequences TSx and TSy are used respectively. The function of loading an identity ID signal is integrated in a module for inserting a training sequence. Referring to FIG. 17, the process of the method provided in an embodiment is as follows specifically:

1701: Receive a data frame containing multiple code words of the LDPC convolutional code, where the multiple code words of the LDPC convolutional code are obtained according to the coding of the check matrix Hc of the time-varying periodic LDPC convolutional code, the Hc is obtained according to a QC-LDPC check matrix, a training sequence used to identify the correspondence between the multiple code words of the LDPC convolutional code and the Hc is added in the data frame, and the training sequence is the one used at the time of transmitting the data frame.

Specifically, an embodiment does not limit the content of a specific received data frame, and the LDPC convolutional code words in the data frame may be obtained by performing the coding according the embodiment methods provided by this disclosure, that is, the LDPC convolutional code words may be obtained according to the coding of the check matrix Hc of the time-varying periodic LDPC convolutional code, and the Hc is also obtained according to the QC-LDPC check matrix. For details about the process of constructing the Hc, refer to descriptions provided above. Because of time-varying period characteristics of the LDPC convolutional code, a training sequence used to identify the correspondence between the multiple code words of the LDPC convolutional code and the Hc is added in the received data frame. As shown in FIG. 7, the training sequence is the one used at the time of transmitting the data frame, so that the decoding is implemented in a follow-up step through the identification of the training sequence.

1702: Obtain the Hc that is used when the multiple code words of the LDPC convolutional code are obtained by performing coding, identify the training sequence used at the time of transmitting the data frame, and determine the correspondence between the multiple code words of the LDPC convolutional code and the Hc according to the training sequence.

For this step, with reference to the description about adding a training sequence, if parameters T=MS=4 and C/P=6 are determined, to ensure that C is divisible by 6 and take the factors such as performance and complexity into consideration, C=2532 may be selected to construct the check matrix Hc, where the process of constructing the check matrix Hc is the same as the description about the process of constructing the Hc. When P=C/6=422, a QC-LDPC block code check matrix Hb formed by 24*4 small matrixes is constructed first, where each small matrix is a 422×422 unit circulant matrix; then, split, shift, and stretch are performed along a boundary of small matrixes of the Hb to form a LDPC convolutional code check matrix Hc in a ladder form. The correspondence between the code words and the Hc is shown in FIG. 18.

If no interleaver is used at a transceiver end, a code, such as C4 code, corresponding to an Hc4 layer is put in a training sequence period of a path XI. The C4 code and front C3, C2, and C1 are combined to meet a check relationship of the Hc4 layer; and a code corresponding to an Hc3 layer is put in a path XQ. The rest may be deduced by analogy; for the correspondence indicated by a dashed arrow in Table 1, the receiving end determines an initial position of the code words according to a position of the training sequence; meanwhile, XI, XQ, YI, and YQ are corresponding to code words at different layers separately, so that the decoding may be performed through the combination of the code words. If an interleaver is used at the transceiver end, after a position of a training sequence is detected, a position of a code word block corresponding to each layer of the Hc needs to be determined with reference to an interleaving relationship. That is, de-interleaving is performed first and then a position of a code word block is determined, so as to complete the detection of the identity signal. The correspondence is shown by a dashed box in the following Table 1.

TABLE 1

| Training sequence | Four-line modulation | Interleaving correspondence | Corresponding $H_c$ layer |
|---|---|---|---|
| TSx | X1 | | Hc4 |
| TSx | XQ | | Hc3 |
| TSy | Y1 | | Hc2 |
| TSy | YQ | | Hc1 |

1703: Decode the multiple code words of the LDPC convolutional code according to the determined correspondence between the multiple code words of the LDPC convolutional code and the H.

Specifically, an embodiment does not limit a specific decoding process. In the actual application, after the correspondence between the multiple code words of the LDPC convolutional code and the $H_c$ is determined in step 1402, the step may be used to form front and back code words to those with a length of constraint code words according to the obtained correspondence between the multiple code words of the LDPC convolutional code and the $H_c$, and then soft-decision decoding is performed according to the check relationship of the corresponding $H_c$ layers. For example, as shown in FIG. 18, (C8, C7, C6, C5)*$H_{c4}$=0, (C9, C8, C7, C6)*$H_{c3}$=0, (C10, C9, C8, C7)*$H_{c2}$=0, and (C11, C10, C9, C8)*$H_{c1}$=0. Furthermore, with reference to the schematic structural diagram of the optical transmission system shown in FIG. 16, the receiving end for receiving coded data in the optical transmission system may further perform the processes such as analog-to-digital conversion, digital equalization, and de-interleaving before decoding the received coded data, and may further output the decoded data into the OTU de-framing module after the decoding.

In the method provided in an embodiment, the correspondence between the code words and the check matrix $H_c$ is determined by identifying a training sequence used at the time of transmitting a data frame and added in the data frame, so as to implement the decoding of received coded data. Therefore, the method is not only applicable to a high-speed optical transmission system but also meets the requirements of high-gain performance and high throughput.

Figure 19:
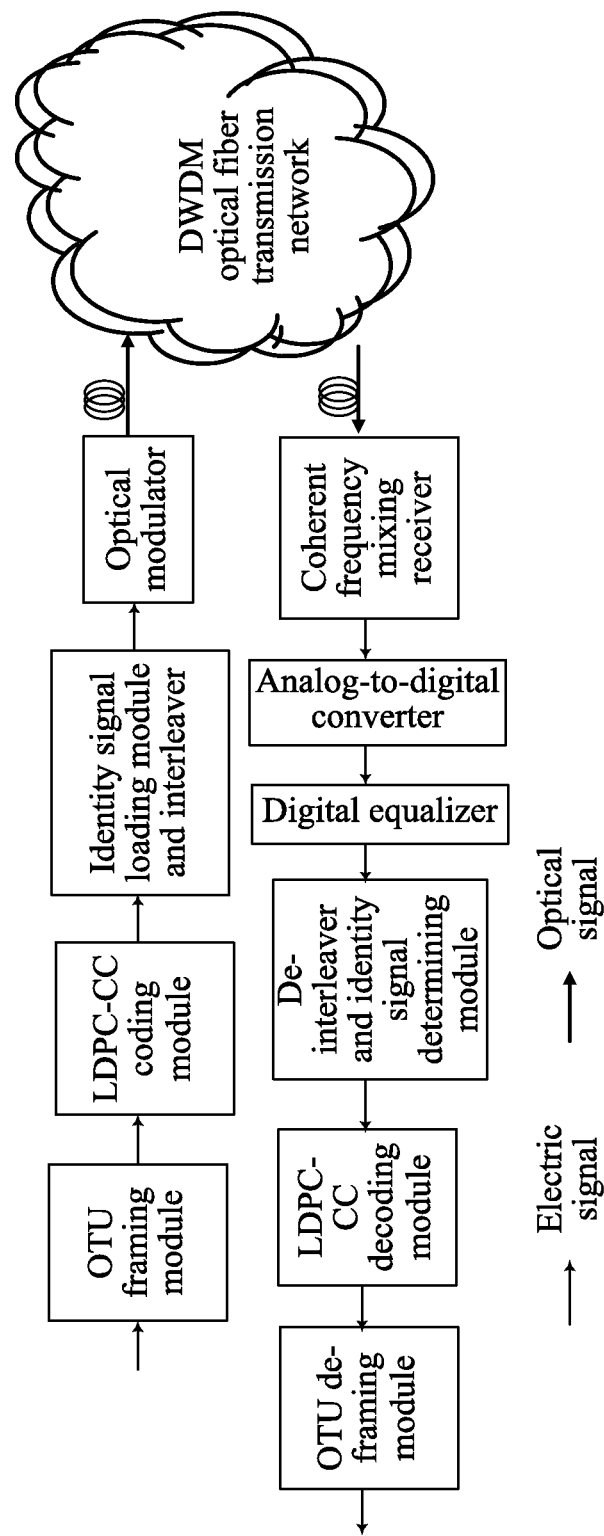
FIG. 19 is a schematic structural diagram of an optical transmission system provided by this disclosure.

For the case in which an identity of the correspondence between code words and $H_c$ is inserted in an initial position of code words of a data frame, an embodiment provides a decoding method for forward error correction. In the method, by identifying the identity of the correspondence between the code words and the $H_c$ inserted in the data frame, the correspondence between the code words and the check matrix $H_c$ is determined, so as to implement the decoding of received coded data. In this case, a structure of an optical transmission system is shown in FIG. 19. After the coding, loading of an identity signal, interleaving and optical modulation, the data output by the OTU framing module is transmitted into a DWDM optical fiber transmission network. Referring to FIG. 20, the process of the decoding method for forward error correction provided in an embodiment is specifically as follows:

2001: Receive a data frame containing multiple code words of the LDPC convolutional code, where the multiple code words of the LDPC convolutional code are obtained according to the coding of the check matrix $H_c$ of the time-varying periodic LDPC convolutional code, the $H_c$ is obtained according to a QC-LDPC check matrix, and the identity of the correspondence between the code words and the $H_c$ is inserted in the initial position of the code words of the data frame.

Specifically, an embodiment does not limit the content of a specific received data frame, and the LDPC convolutional code words in the data frame may be obtained by performing the coding according to embodiment methods provided by this disclosure, that is, the LDPC convolutional code words may be obtained according to the coding of the check matrix $H_c$ of the time-varying periodic LDPC convolutional code, and the $H_c$ is also obtained according to the QC-LDPC check matrix. For details about the process of constructing the $H_c$, refer to the descriptions provided above. Because of time-varying period characteristics of the LDPC convolutional code, in the received data frame, the identity of the correspondence between the code words and the $H_c$ is inserted in the initial position of the code words of the data frame. As shown in FIG. 8, in a follow-up step, the decoding is implemented through the identification of the identity of the correspondence.

2002: Obtain the $H_c$ that is used when the multiple code words of the LDPC convolutional code are obtained by performing coding, identify the identity of the correspondence between the code words and the $H_c$, and determine the correspondence between the multiple code words of the LDPC convolutional code and the $H_c$ according to the identity of the correspondence.

For this step, an embodiment does not limit the manner of identifying the identity of the correspondence between the code words and the H. When the correspondence between the multiple code words of the LDPC convolutional code and the $H_c$ is determined according to the identity of the correspondence, likewise, after C is determined according to factors such as the complexity of the implementation, the split, then shift, and stretch are performed on an obtained QC-LDPC block code check matrix $H_c$ with a girth greater than 6 along a boundary of each layer of matrixes, so as to obtain the $H_c$. The check correspondence between the code words and the $H_c$ is shown in FIG. 21.

2003: Decode the multiple code words of the LDPC convolutional code according to the determined correspondence between the multiple code words of the LDPC convolutional code and the $H_c$.

Specifically, an embodiment does not limit a specific decoding process. In the actual application, after the correspondence between the multiple code words of the LDPC convolutional code and the $H_c$ is determined in step 2002, the step may be used to form front and back code words to those with a length of constraint code words according to the obtained correspondence between the multiple code words of the LDPC convolutional code and the $H_c$, and then soft-decision decoding is performed according to the check relationship of the corresponding $H_c$ layers. For example, as shown in FIG. 21, (C8, C7, C6, C5)*$H_{c4}$=0, (C9, C8, C7, C6)*$H_{c3}$=0, (C10, C9, C8, C7)*$H_{c2}$=0, and (C11, C10, C9, C8)*$H_{c1}$=0. Furthermore, with reference to the schematic structural diagram of the optical transmission system shown in FIG. 19, a receiving end for receiving coded data in the optical transmission system may further perform the processes such as analog-to-digital conversion, digital equalization, and de-interleaving before decoding the received coded data, and may further output the decoded data into the OTU de-framing module after the decoding.

In an embodiment method, the correspondence between the code words and the check matrix $H_c$ is determined by identifying the identity of the correspondence between the code words and the $H_c$ inserted in the data frame, so as to implement the decoding of the received coded data. Therefore, the method is not only applicable to a high-speed optical transmission system but also meets the requirements of high-gain performance and high throughput.

Figure 22:
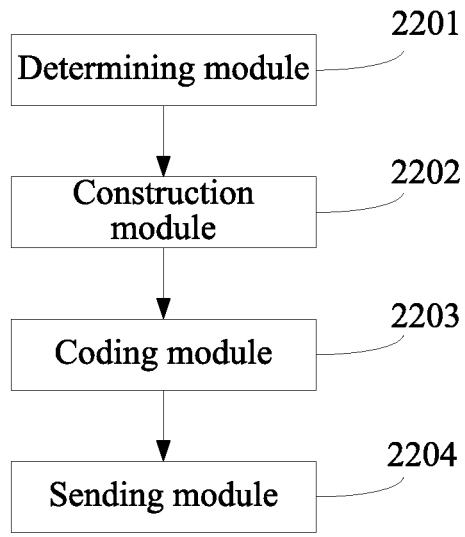
FIG. 22 is a schematic structural diagram of a coding apparatus for forward error correction provided by this disclosure.

An embodiment provides a coding apparatus for forward error correction. The apparatus is configured to implement the coding method for forward error correction. Referring to FIG. 22, the apparatus includes: a determining module 2201, configured to determine check matrix parameters of time-varying periodic LDPC convolutional code according to the performance, complexity of a transmission system, and a synchronization manner for code word alignment; a construction module 2202, configured to construct a QC-LDPC check matrix according to the check matrix parameters determined by the determining module 2201, and obtain a check matrix ($H_c$) of the time-varying periodic LDPC convolutional code according to the QC-LDPC check matrix; a coding module 2203, configured to de-block, according to the requirements of the $H_c$ obtained by the construction module 2202, data to be coded, and code data of each sub-block according to the $H_c$ so as to obtain multiple code words of the LDPC convolutional code; and a sending module 2204, configured to add the multiple code words of the LDPC convolutional code obtained by the coding module 2203 by performing the coding in a data frame and send the data frame.

It should be noted that it is unnecessary to construct the $H_c$ through the determining module 2201 and the construction module 2202 each time when the apparatus provided in an embodiment performs the coding for forward error correction. That is, after the $H_c$ is obtained through the determining module 2201 and the construction module 2202 at the first time, the constructed $H_c$ may be directly used to perform the coding when forward error correction is performed next time, thereby improving the coding efficiency. Furthermore, the coding module 2203 and the sending module 2204 may further be placed at a sending end of an optical transmission system.

Figure 23:
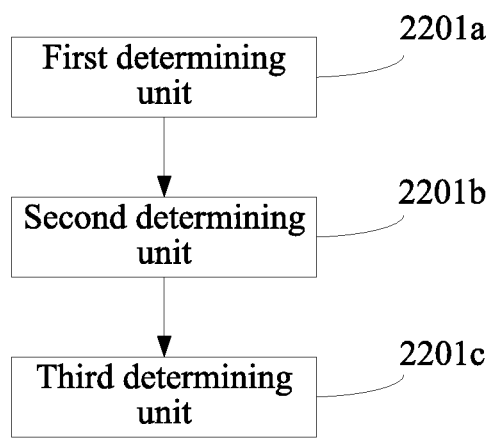
FIG. 23 is a schematic structural diagram of a determining module provided by this disclosure.

Furthermore, referring to FIG. 23, the determining module 2201 specifically includes: a first determining unit 2201a, configured to determine R, T, and Ms according to the performance and complexity of the transmission system, where R is a rate, T is a time-varying period, and Ms is the number of sub-matrixes in $H_c$ in each T; a second determining unit 2201b, configured to determine a length C of each code word block according to a synchronization manner for code word alignment; and a third determining unit 2201c, configured to determine a parity bit length P according to R determined by the first determining unit 2201a and C determined by the second determining unit 2201b.

Figure 24:
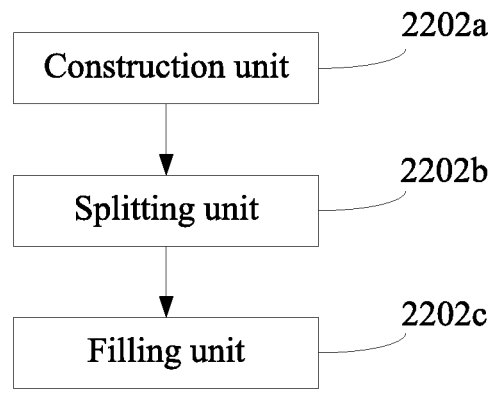
FIG. 24 is a schematic structural diagram of a construction module provided by this disclosure.

Referring to FIG. 24, the construction module 2202 specifically includes: a construction unit 2202a, configured to construct a quasi-cyclic QC-LDPC check matrix with a preset girth according to T, Ms, C, and P determined by the determining module 2201; a splitting unit 2202b, configured to split the QC-LDPC check matrix constructed by the construction unit 2202a into Ms sub-matrixes based on columns, and into T sub-matrixes based on rows, so as to obtain Ms*T sub-matrixes; and a filling unit 2202c configured to fill, in a preset order, the Ms*T sub-matrixes split by the splitting unit 2202b into Ms*T positions in each period, so as to obtain the $H_c$.

For a detailed process in which the determining module 2201 determines the check matrix parameters and the construction module 2202 obtains the $H_c$, refer to related description in step 101. The details are not described again herein.

Figure 25:
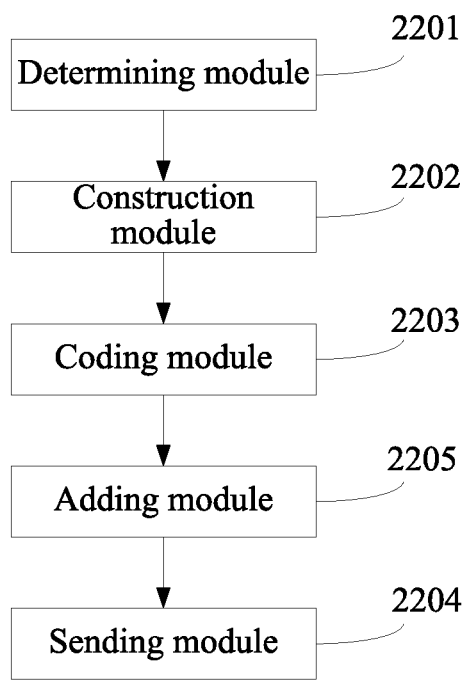
FIG. 25 is a schematic structural diagram of another coding apparatus for forward error correction provided by this disclosure.

Preferably, to enable a receiving end for coding data to specify the correspondence between the code words and the check matrix, so as to perform the decoding correctly, referring to FIG. 25, the apparatus further includes: an adding module 2205, configured to add an identity signal in the data frame sent by the sending module 2204, where the identity signal is used to identify the correspondence between the multiple code words of the LDPC convolutional code and the $H_c$, so that the receiving end identifies the correspondence between the multiple code words of the LDPC convolutional code and the $H_c$ according to the identity signal, and decodes the multiple LDCP convolutional code words according to the $H_c$.

Furthermore, the adding module 2205 is specifically configured to add an FAS within a frame header of a data frame in the data frame as an identity signal; or add a training sequence used at the time of transmitting a data frame in the data frame as an identity signal; or insert an identity of the correspondence between the code words and the $H_c$ in an initial position of the code words in the data frame, where the inserted identity of the correspondence is used as an added identity signal.

For a specific manner for the adding module 2205 to add an identity signal, refer to related description in step 101. The details are not described again herein.

A check matrix of the QC-LDPC is formed by cyclic shift matrixes, and the check characteristics of the cyclic shift may decrease the implementation complexity of the check significantly. Furthermore, the performance of LDPC convolutional code is better than that of LDPC block codes, and the performance of time-varying LDPC convolutional code is better than that of time-invariant LDPC convolutional code. Therefore, the apparatus provided in an embodiment performs the forward error correction by using the time-varying periodic LDPC convolutional code with a QC-LDPC structure, so the apparatus is not only applicable to a high-speed optical transmission system, but also meets the requirements of high-gain performance and high throughput.

Figure 26:
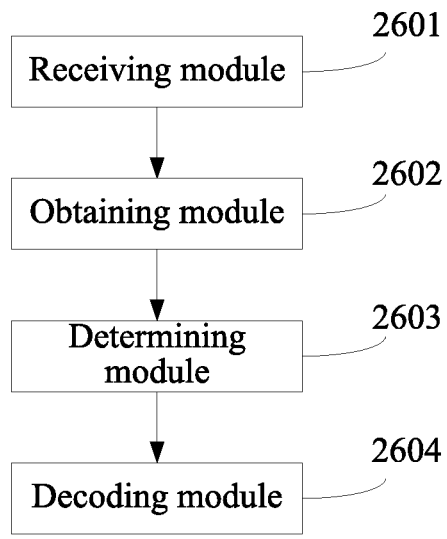
FIG. 26 is a schematic structural diagram of a decoding apparatus for forward error correction provided by this disclosure.

An embodiment provides a decoding apparatus for forward error correction. The apparatus is configured to implement the decoding methods for forward error correction, and may be placed at a receiving end in an optical transmission system. Referring to FIG. 26, the apparatus includes: a receiving module 2601, configured to receive a data frame containing multiple LDPC convolutional code words, where the multiple code words of the LDPC convolutional code are obtained according to the coding of a check matrix ($H_c$); an obtaining module 2602, configured to obtain the $H_c$ that is used when the multiple code words of the LDPC convolutional code are obtained by performing coding; a determining module 2603, configured to determine the correspondence between the multiple code words of the LDPC convolutional code in the data frame received by the receiving module 2601 and the $H_c$ obtained by the obtaining module 2602; and a decoding module 2604, configured to decode the multiple code words of the LDPC convolutional code according to the correspondence determined by the determining module 2603.

Furthermore, the $H_c$ obtained by the obtaining module 2602 is obtained before the coding by using the following manners: determining R, T, and Ms according to the performance and complexity of the transmission system, where the R is a rate, the T is a time-varying period, and the Ms is the number of sub-matrixes in the $H_c$ in each T; determining a length C of each code word block according to the synchronization manner for code word alignment, and determining a parity bit length P according to the R and C; constructing a quasi-cyclic QC-LDPC check matrix with a preset girth according to the T, $M_S$, C, and P; splitting the QC-LDPC check matrix into Ms sub-matrixes based on columns, and into T sub-matrixes based on rows, so as to obtain Ms*T sub-matrixes; and filling, in a preset order, the Ms*T sub-matrixes into Ms*T positions in each period, so as to obtain the H.

Figure 27:
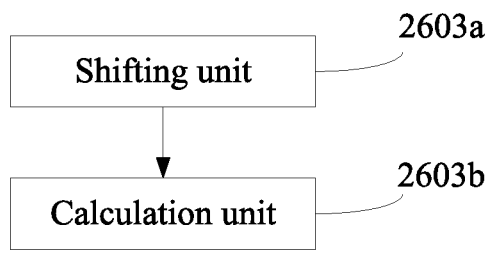
FIG. 27 is a schematic structural diagram of a determining module provided by this disclosure.

Referring to FIG. 27, the determining module 2603 includes: a shifting unit 2603*a*, configured to shift the; and a calculation unit 2603*b*, configured to calculate a syndrome $S=r*H_c^t$ once in each shift of the shifting unit 2603*a*, and when the maximum number of check relationships is met, obtain the correspondence between the multiple code words of the LDPC convolutional code and the $H_c$, where r is a code stream containing multiple code words of the LDPC convolutional code.

For the detailed process in which the determining module 2603 shown in FIG. 27 determines the correspondence between the code words and the check matrix, refer to related description in step 1102. The details are not described again herein.

Optionally, an identity signal is added in a data frame received by the receiving module 2601, where the identity signal is used in the correspondence between the multiple code words of the LDPC convolutional code and the $H_c$.

Figure 28:
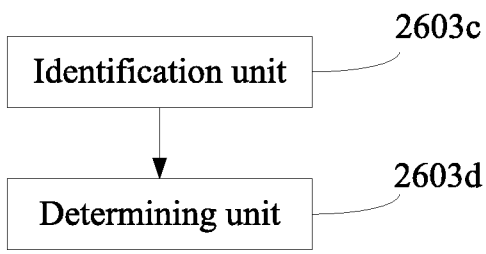
FIG. 28 is a schematic structural diagram of another determining module provided by this disclosure.

Referring to FIG. 28, the determining module 2603 includes: an identification unit 2603*c*, configured to identify the identity signal added in the data frame received by the receiving module 2601; and a determining unit 2603*d*, configured to determine the correspondence between the multiple code words of the LDPC convolutional code and the $H_c$ according to the identity signal identified by the identification unit 2603*c*.

In one example, the identity signal is the frame header FAS of the data frame, the identification unit 2603*c* is configured to identify the frame header FAS of the data frame, and the determining unit 2603*d* is configured to determine the correspondence between the multiple code words of the LDPC convolutional code and the $H_c$ according to the frame header FAS of the data frame identified by the identification unit 2603*c*. For the detailed processes, refer to related description in step 1402, and the details are not described again herein.

In another example, the identity signal is a training sequence used at the time of transmitting a data frame, the identification unit 2603*c* is configured to identify the training sequence used at the time of transmitting the data frame, and the determining unit 2603*d* is configured to identify the correspondence between the multiple code words of the LDPC convolutional code and the $H_c$ according to the training sequence identified by the identification unit 2603*c*. For the detailed processes, refer to related description in step 1702, and the details are not described again herein.

In yet another example, the identity signal is an identity of the correspondence between code words and the $H_c$ inserted in an initial position of the code words in a data frame, the identification unit 2603*c* is configured to identify the identity of the correspondence between the code words and the $H_c$, and the determining unit 2603*d* is configured to determine the correspondence between the multiple code words of the LDPC convolutional code and the $H_c$ according to the identity of the correspondence identified by the identification unit 2603*c*. For the detailed processes, refer to related description in step 2002, and the details are not described again herein.

By determining the correspondence between the code words and the check matrix in coded data and decoding received coded data according to the determined correspondence, the apparatus provided in an embodiment may be not only applicable to a high-speed optical transmission system but also meet the requirements of high-gain performance and high throughput.

Figure 29:
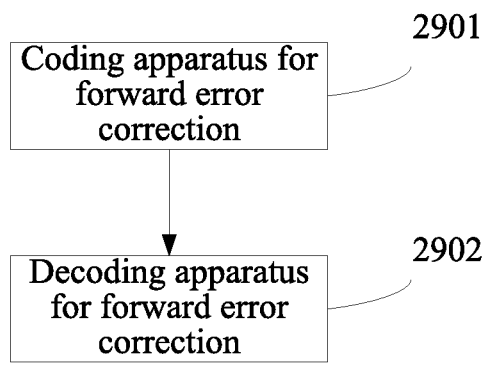
FIG. 29 is a schematic structural diagram of a system for forward error correction provided by this disclosure.

An embodiment provides a system for forward error correction. Referring to FIG. 29, the system includes a coding apparatus 2901 for forward error correction and a decoding apparatus 2902 for forward error correction.

The coding apparatus 2901 for forward error correction is the same as the coding apparatus for forward error correction.

The decoding apparatus 2902 for forward error correction is the same as the decoding apparatus for forward error correction.

Furthermore, the number of the coding apparatus 2901 for forward error correction and the number of the decoding apparatus 2902 for forward error correction are both one or multiple.

Figure 30:
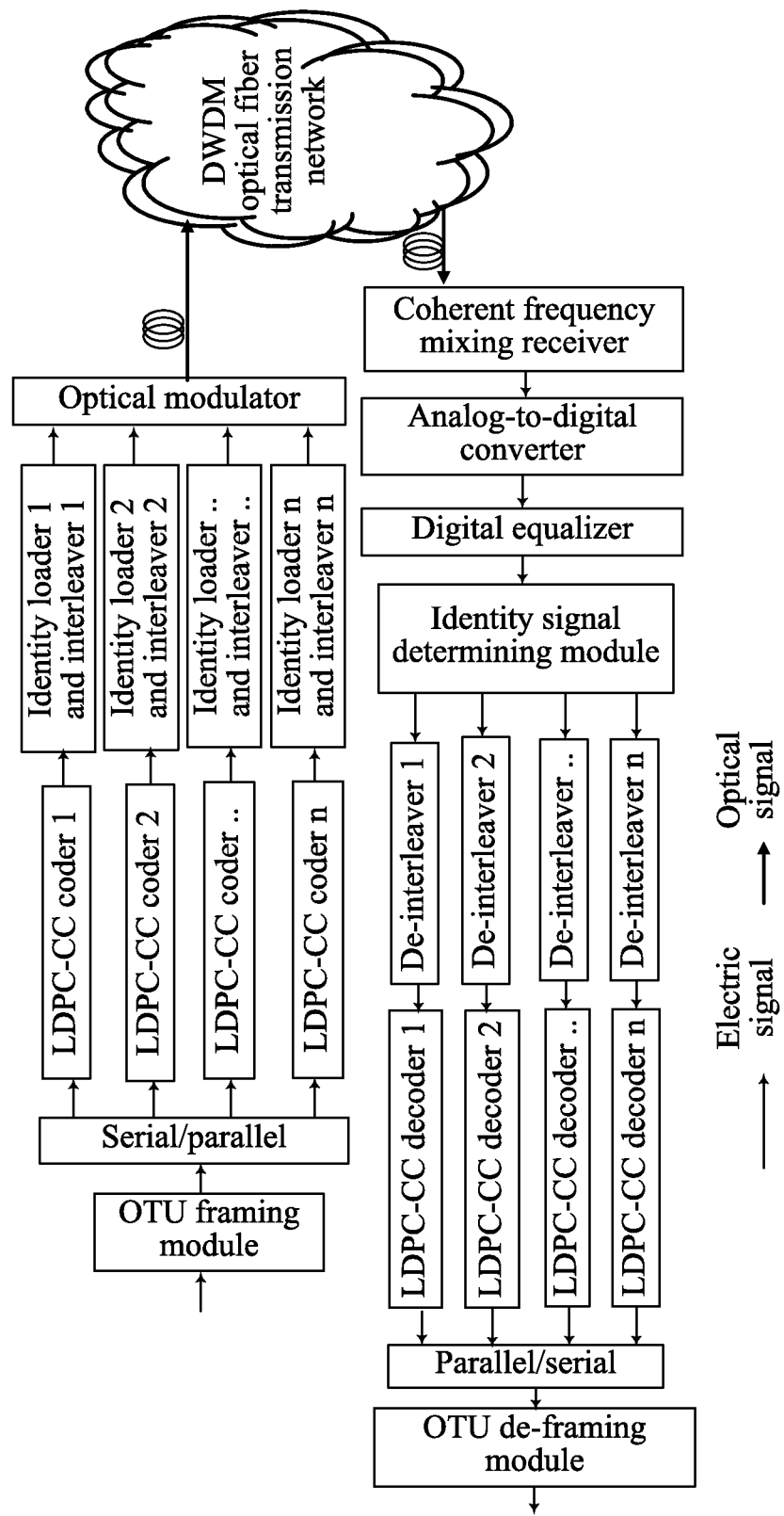
FIG. 30 is a schematic structural diagram of an optical transmission system provided by this disclosure.

When the number of the coding apparatuses 2901 for forward error correction and the number of the decoding apparatuses 2902 for forward error correction are both multiple, the system for forward error correction may be used in the optical transmission system, and a structure of the optical transmission system may be shown in FIG. 30, where functions implemented by an LDPC-CC coder and an identity loading module are equivalent to functions implemented by the coding apparatus 2901 for forward error correction, and functions implemented by an identity signal determining module and an LDPC-CC decoder are equivalent to functions implemented by the decoding apparatus 2902 for forward error correction. LDPC convolutional code check matrix corresponding to each path is constructed based on the check matrix of the QC-LDPC, by using the methods provided herein. An identity signal may be obtained through a combination of four manners. For example, when n is equal to 4, that is, there are four paths of coders/decoders, the coding and decoding of LDPC convolutional code may be performed respectively on the four paths of XI, XQ, YI, and YQ signals. The specific identification methods are as follows: 1. an initial position of the code word blocks: identification is performed by using a training sequence used by the equalization; 2. the correspondence of check layers between the code words and the $H_c$: the identification is performed by adding an additional independent bit sequence; 3. corresponding coder/decoder sequence numbers: the four paths of XI, XQ, YI, and YQ are corresponding to four paths of coder/decoder sequence numbers.

The system provided in an embodiment performs the forward error correction by using time-varying periodic LDPC convolutional code with a QC-LDPC structure. A check matrix of the QC-LDPC is formed by cyclic shift matrixes, and the check characteristics of the cyclic shift may decrease the implementation complexity of the check significantly; furthermore, the performance of LDPC convolutional code is better than that of LDPC block codes, and the performance of time-varying LDPC convolutional code is better than that of time-invariant LDPC convolutional code. Therefore, the system is not only applicable to the high-speed optical transmission system, but also meets the requirements of high-gain performance and high throughput.

It should be noted that the coding and decoding method, apparatus, and system for forward error correction provided in the foregoing embodiments may be used not only in the high-speed optical transmission system, but also in other systems requiring both FEC performance and high throughput, and meanwhile restricting complexity of the FEC implementation. The embodiments do not limit specific application scenarios. Furthermore, when the coding apparatus for forward error correction provided in the foregoing embodiments performs the coding for forward error correction, and the decoding apparatus for forward error correction performs the decoding for forward error correction, only the classification of the foregoing functional modules is described. In actual implementation, the foregoing functions may be assigned to and implemented by different functional modules as required, that is, the internal structure of the apparatus may be classified into different functional modules to complete all or part of functions described above. In addition, the coding and decoding apparatuses for forward error correction and the system for forward error correction provided in the foregoing embodiments and the corresponding coding and decoding method embodiments for forward error correction are based on the same thoughts. For the details about specific implementation processes thereof, refer to the method embodiments, and the details are not described again herein.

The sequence numbers of the preceding embodiments of the present invention are merely for description purpose but do not indicate the preference of the embodiments.

Certain steps in the embodiments of the present invention may be implemented by using software. The corresponding software program may be stored in a readable storage medium, such as optical disk or hard disk.

The foregoing describes only exemplary embodiments of the present invention and is not intended to limit the present invention. Any modification, equivalent replacement, or improvement made without departing the spirit and principle of the present invention shall fall within the protection scope of the present invention.

What is claimed is:

1. A coding method for forward error correction, comprising:
    determining, by a transmitter of an optical transmission system, check matrix parameters of a time-varying periodic low density parity check (LDPC) convolutional code according to performance of a transmission system, complexity of the transmission system, and a synchronization manner for code word alignment;
    constructing, by the transmitter of the optical transmission system, a quasi-cyclic low density parity check (QC-LDPC) check matrix according to the determined check matrix parameters;
    obtaining, by the transmitter of the optical transmission system, a check matrix of the time-varying periodic LDPC convolutional code according to the QC-LDPC check matrix;
    obtaining, by the transmitter of the optical transmission system, electrical data to be coded;
    arranging, by the transmitter of an optical transmission system, according to the check matrix, the electrical data to be coded into sub-blocks, and coding electrical data of each of the sub-blocks according to the check matrix to obtain multiple code words of the LDPC convolutional code;
    adding, by the transmitter of the optical transmission system, the multiple code words of the LDPC convolutional code in a electrical data frame, the multiple code words being configured to be decoded in parallel by a receiver according to a correspondence between the multiple code words of the LDPC convolutional code and the QC-LDPC check matrix by shifting the multiple code words of the LDPC convolution code;
    calculating, by the transmitter of the optical transmission system, a syndrome(S) in accordance with $S=r*H_c^t$, wherein $H_c$, is the QC-LDPC check matrix, and wherein r is a code stream containing the multiple code words of the LDPC convolutional code;
    interleaving, by an interleaver of the transmitter of the optical transmission system, the electrical data frame with a second electrical data frame to produce interleaved frames;
    optically modulating, by an optical modulator of the transmitter of the optical transmission system, the interleaved frames to produce optical frames; and
    transmitting, by the transmitter of an optical transmission signal comprising the optical frames over an optical fiber in a dense wavelength division multiplexing (DWDM) optical fiber transmission network, the optical frame.

2. The method according to claim 1, wherein determining the check matrix parameters of the time-varying periodic LDPC convolutional code according to the performance of the transmission system, the complexity of the transmission system, and the synchronization manner for code word alignment comprises:
    determining a rate (R), a time-varying period (T), and a number of sub-matrixes (MS) according to the performance and the complexity of the transmission system, wherein the MS is the number of sub-matrixes in the check matrix in each T; and
    determining a length (C) of each code word block according to the synchronization manner for code word alignment, and determining a parity bit length (P) according to the R and the C, and
    wherein constructing the QC-LDPC check matrix according to the determined check matrix parameters, and obtaining the check matrix of the time-varying periodic LDPC convolutional code according to the QC-LDPC check matrix comprises:
        constructing the QC-LDPC check matrix with a preset girth according to the T, the MS, the C, and the P;
        splitting the QC-LDPC check matrix into the MS number of sub-matrixes based on columns, and into the T number of sub-matrixes based on rows to obtain MS*T sub-matrixes; and
        filling, in a preset order, the MS*T sub-matrixes into MS*T positions in each period to obtain the check matrix.

3. The method according to claim 1, wherein, before adding the multiple code words of the LDPC convolutional code in the data frame and sending the data frame, the method further comprises:
    adding an identity signal in the data frame, wherein the identity signal is used to identify the correspondence between the multiple code words of the LDPC convolutional code and the check matrix to prompt a receiver to identify the correspondence between the multiple code words of the LDPC convolutional code and the check matrix according to the identity signal, and to decode the multiple code words of the LDPC convolution code according to the check matrix.

4. The method according to claim 3, wherein adding the identity signal in the data frame comprises:
adding either a frame alignment signal (FAS) of the data frame or a training sequence used at the time of transmitting the data frame in the data frame as the identity signal.

5. The method according to claim 3, wherein adding the identity signal in the data frame comprises:
inserting an identity of the correspondence between the code words and the check matrix in a start position of the code words in the data frame, wherein the inserted identity of the correspondence is used as the added identity signal.

6. A decoding method for forward error correction, comprising:
receiving, by a coherent frequency mixing receiver of a receiver of an optical transmission system, from a dense wavelength division multiplexing (DWDM) optical fiber transmission network, optical frames, to produce coherently frequency mixed frames;
converting, by an analog-to-digital converter of the receiver of the optical transmission system, the coherently frequency mixed frames, to digital frames;
equalizing, by a digital equalizer of the receiver of the optical transmission system, the digital frames, to produce equalized frames;
de-interleaving, by a de-interleaver of the receiver of the optical transmission system, to produce a data frame, wherein the data frame comprises contains multiple code words of a low density parity check (LDPC) convolution code, wherein the multiple code words of the LDPC convolution code are obtained by performing coding according to a quasi-cyclic low density parity check (QC-LDPC) check matrix of time-varying LDPC convolution code;
obtaining, by the receiver of the optical transmission system, the QC-LDPC check matrix that is used when the multiple code words of the LDPC convolutional code are obtained by performing coding, determining a correspondence between the multiple code words of the LDPC convolutional code and the QC-LDPC check matrix, comprising:
shifting the multiple code words of the LDPC convolution code; and
calculating a syndrome(S) in accordance with $S=r*H_c^t$, wherein $H_c$ is the QC-LDPC check matrix, and wherein r is a code stream containing the multiple code words of the LDPC convolutional code;
decoding, by the receiver of the optical transmission system, the multiple code words of the LDPC convolutional code according to the correspondence between the multiple code words of the LDPC convolutional code and the QC-LDPC check matrix, to produce decoded data, the multiple code words being decoded in parallel; and
outputting, by the receiver of the optical transmission system, the decoded data.

7. The method according to claim 6, wherein the QC-LDPC check matrix is determined by:
determining a rate (R), a time-varying period (T), and a number of sub-matrixes (MS) according to performance and complexity of a transmission system, wherein the MS is the number of sub-matrixes in the QC-LDPC check matrix in each T;
determining a length C of each code word block according to a synchronization manner for code word alignment, and determining a parity bit length P according to the R and the C;
constructing the QC-LDPC check matrix with a preset girth according to the T, the MS, the C, and the P;
splitting the QC-LDPC check matrix into the MS number of sub-matrixes based on columns, and into the T number of sub-matrixes based on rows to obtain MS*T sub-matrixes; and
filling, in a preset order, the MS*T sub-matrixes into MS*T positions in each period to obtain the QC-LDPC check matrix.

8. The method according to claim 6, wherein calculating the syndrome comprises:
calculating the syndrome once in each shift, and until a maximum number of check relationships is met, obtaining the correspondence between the multiple code words of the LDPC convolutional code and the QC-LDPC check matrix.

9. The method according to claim 6, wherein an identity signal is added in the data frame, and the identity signal is used to identify the correspondence between the multiple code words of the LDPC convolutional code and the QC-LDPC check matrix, and
wherein determining the correspondence between the multiple code words of the LDPC convolutional code and the QC-LDPC check matrix comprises:
identifying the identity signal added in the data frame, and determining the correspondence between the multiple code words of the LDPC convolutional code and the QC-LDPC check matrix according to the identity signal.

10. The method according to claim 9, wherein the identity signal is a frame alignment signal (FAS) of the data frame, and wherein identifying the identity signal added in the data frame and determining the correspondence between the multiple code words of the LDPC convolutional code and the QC-LDPC check matrix according to the identity signal comprises:
identifying the FAS of the data frame, and determining the correspondence between the multiple code words of the LDPC convolutional code and the QC-LDPC check matrix according to the FAS of the data frame.

11. The method according to claim 9, wherein the identity signal is a training sequence used at the time of transmitting the data frame, and wherein identifying the identity signal added in the data frame, and determining the correspondence between the multiple code words of the LDPC convolutional code and the QC-LDPC check matrix according to the identity signal comprises:
identifying the training sequence used at the time of transmitting the data frame, and identifying the correspondence between the multiple code words of the LDPC convolutional code and the QC-LDPC check matrix according to the training sequence.

12. The method according to claim 9, wherein the identity signal is an identity of the correspondence between the code words and the QC-LDPC check matrix inserted in an initial position of the code words in the data frame, and wherein identifying the identity signal added in the data frame and determining the correspondence between the multiple code words of the LDPC convolutional code and the QC-LDPC check matrix according to the identity signal comprises:
identifying the identity of the correspondence between the code words and the QC-LDPC check matrix, and determining the correspondence between the multiple code words of the LDPC convolutional code and the QC-LDPC check matrix according to the identity of the correspondence.

13. A transmitter of an optical transmission system for forward error correction, comprising:
   a processor;
   a non transitory computer readable storage medium storing programming for execution by the processor, the programming including instructions to:
      determine check matrix parameters of a time-varying periodic low density parity check (LDPC) convolutional code according to performance of a transmission system, complexity of the transmission system, and a synchronization manner for code word alignment;
      construct a quasi-cyclic low density parity check (QC-LDPC) check matrix according to the check matrix parameters, and obtain a check matrix of the time-varying periodic LDPC convolutional code according to the QC-LDPC check matrix;
      obtain data to be coded;
      arrange, according to the check matrix, the data to be coded into sub-blocks, and code data of each sub-block according to the check matrix to obtain multiple code words of the LDPC convolutional code;
      add the multiple code words of the LDPC convolutional code through coding in a data frame, the multiple code words being configured to be decoded in parallel by a receiver according to a correspondence between the multiple code words of the LDPC convolutional code and the QC-LDPC check matrix by shifting the multiple code words of the LDPC convolution code; and
      calculate a syndrome(S) in accordance with $S=r*H_c^t$, wherein $H_c$ is the QC-LDPC check matrix, and wherein r is a code stream containing the multiple code words of the LDPC convolutional code;
   an interleaver coupled to the processor, the interleaver configured to interleave the data frame with a second data frame to produce interleaved frames; and
   an optical modulator coupled to the interleaver, the optical modulator configured to optically modulate the interleaved frames to produce optical frames and transmit, over a dense wave division multiplexing (DWDM) optical fiber transmission network, the optical frames.

14. The transmitter of the optical transmission system according to claim 13, wherein the programming further includes instructions to:
   determine a rate (R), a time-varying period (T), and a number of sub-matrixes (MS) according to the performance and the complexity of the transmission system, where the MS is the number of sub-matrixes in the check matrix in each T;
   determine a length (C) of each code word block according to the synchronization manner for code word alignment;
   determine a parity bit length (P) according to the R and the C; and
   wherein the instructions to construct the QC-LDPC check matrix and to obtain the check matrix include instructions to construct the QC-LDPC check matrix with a preset girth according to the T, the MS, the C, and the P, to split the QC-LDPC check matrix into the MS number of sub-matrixes based on columns, and into the T number of sub-matrixes based on rows to obtain MS*T sub-matrixes, and to fill, in a preset order, the MS*T sub-matrixes into MS*T positions in each period to obtain the check matrix.

15. The transmitter of the optical transmission system according to claim 13, wherein the programming further includes instructions to:
   add an identity signal in the data frame, wherein the identity signal is configured to identify the correspondence between the multiple code words of the LDPC convolutional code and the check matrix to prompt a receiver to identify the correspondence between the multiple code words of the LDPC convolutional code and the check matrix according to the identity signal, and decode the multiple code words of the LDPC convolution code according to the check matrix.

16. The transmitter of the optical transmission system according to claim 15, wherein the instructions to add the identity signal in the data frame includes instructions to add a frame alignment signal (FAS) of the data frame in the data frame as an identity signal, or to add a training sequence used at the time of transmitting the data frame in the data frame as an identity signal, or to insert an identity of the correspondence between the code words and the check matrix in an initial position of the code words in the data frame, and
   wherein the inserted identity of the correspondence is used as the added identity signal.

17. A receiver of an optical transmission system for forward error correction, comprising:
   a coherent frequency mixing receiver configured to receive, from a dense wavelength division multiplexing (DWDM) optical fiber transmission network, optical frames and convert the optical frames to coherently frequency mixed frames;
   an analog-to-digital converter coupled to the coherent frequency mixing receiver, wherein the analog-to-digital converter is configured to convert the coherently frequency mixed frames to digital frames;
   a digital equalizer coupled to the analog-to-digital converter, wherein the digital equalizer is configured to equalize the digital frames, to produce equalized frames;
   a de-interleaver coupled to the digital equalizer, wherein the de-interleaver is configured to de-interleaver the equalized frames to produce a data frame, wherein data frame comprises contains multiple code words of a low density parity check (LDPC) convolution code, wherein the multiple code words of the LDPC convolution code are obtained by performing coding according to a quasi-cyclic low density parity check (QC-LDPC) check matrix of time-varying LDPC convolution code;
   a processor coupled to the de-interleaver; and
   a non transitory computer readable storage medium storing programming for execution by the processor, the programming including instructions to:
      obtain the QC-LDPC check matrix that is used when the multiple code words of the LDPC convolutional code are obtained by performing coding;
      determine a correspondence between the multiple code words of the LDPC convolutional code in the data frame and the QC-LDPC check matrix, comprising instructions to:
         shift the multiple code words of the LDPC convolution code; and
         calculate a syndrome(S) in accordance with $S=r*H_c^t$, wherein $H_c$, is the QC-LDPC check matrix, and wherein r is a code stream containing the multiple code words of the LDPC convolutional code;

decode the multiple code words of the LDPC convolutional code according to the correspondence between the multiple code words of the LDPC convolutional code and the QC-LDPC check matrix, to produce decoded data, the multiple code words being decoded in parallel; and output the decoded data.

18. The receiver of the optical transmission system according to claim 17, wherein the instructions to calculate the syndrome include instructions to:

calculate the syndrome once in each shift, and until a maximum number of check relationships is met, obtain the correspondence between the multiple code words of the LDPC convolutional code and the QC-LDPC check matrix.

19. The receiver of the optical transmission system according to claim 17, wherein an identity signal is added in the data frame, and wherein the identity signal is used to identify an initial position of the code words in the data frame, a number of layers corresponding to the QC-LDPC check matrix, and a number of paths of coded data flows; and wherein the instructions to determine the correspondence between the multiple code words of the LDPC convolutional code in the data frame and the QC-LDPC check matrix include instructions to:

identify the identity signal added in the data frame; and determine the correspondence between the multiple code words of the LDPC convolutional code and the QC-LDPC check matrix according to the identity signal.

20. The receiver of the optical transmission system according to claim 19, wherein the identity signal is a frame alignment signal (FAS) of the data frame, and wherein the instructions to identify the identity signal added in the data frame include instructions to identify a frame header FAS of the data frame, and the instructions to determine the correspondence between the multiple code words of the LDPC convolutional code in the data frame and the QC-LDPC check matrix include instructions to determine the correspondence between the multiple code words of the LDPC convolutional code and the check matrix according to the FAS within the frame header FAS of the data frame; or the identity signal is a training sequence used at the time of transmitting the data frame, and the instructions to identify the identity signal added in the data frame include instructions to identify the training sequence used at the time of transmitting the data frame, and the instructions to determine the correspondence between the multiple code words of the LDPC convolutional code in the data frame and the check matrix include instructions to determine the correspondence between the multiple code words of the LDPC convolutional code and the check matrix according to the training sequence; or the identity signal is an identity of the correspondence between the code words and the check matrix inserted in the initial position of the code words of the data frame, and the instructions to identify the identity signal added in the data frame include instructions to identify the identity of the correspondence between the code words and the check matrix, and the instructions to determine the correspondence between the multiple code words of the LDPC convolutional code in the data frame and the check matrix include instructions to determine the correspondence between the multiple code words of the LDPC convolutional code and the check matrix according to the identity of the correspondence.

21. An optical signal transmission system, comprising a transmitter, an interleaver, and an optical modulator, wherein the transmitter comprises an Optical Transmission Unit (OTU) packet framer and a packet coder, wherein the transmitter is configured to:

determine check matrix parameters of a time-varying periodic low density parity check (LDPC) convolutional code according to performance of a transmission system, complexity of the transmission system, and a synchronization manner for code word alignment;

construct a quasi-cyclic low density parity check (QC-LDPC) check matrix according to the determined check matrix parameters;

obtain a check matrix of the time-varying periodic LDPC convolutional code according to the QC-LDPC check matrix;

obtain electrical data to be coded;

arrange, according to the check matrix, the electrical data to be coded into sub-blocks in an electrical data frame, and code electrical data of each of the sub-blocks according to the check matrix to obtain multiple code words of the LDPC convolutional code;

add the multiple code words of the LDPC convolutional code to the electrical data frame, wherein the multiple code words are configured to be decoded in parallel by a receiver according to a correspondence between the multiple code words of the LDPC convolutional code and the QC-LDPC check matrix by shifting the multiple code words of the LDPC convolution code;

calculate, by the optical signal transmission system, a syndrome (S) in accordance with $S = r*H_c^{t}$, wherein $H_c$ is the QC-LDPC check matrix, and wherein r is a code stream containing the multiple code words of the LDPC convolutional code;

wherein the interleaver is configured to interleave the electrical data frame with a second electrical data frame to produce interleaved frames;

wherein the optical modulator is configured to optically modulate the interleaved frames to produce optical frames; and wherein the transmitter is further configured to transmit an optical signal comprising the optical frames over an optical fiber in a dense wavelength division multiplexing (DWDM) optical fiber transmission network.

* * * * *